(12) United States Patent
Woo et al.

(10) Patent No.: US 10,199,608 B2
(45) Date of Patent: Feb. 5, 2019

(54) ORGANIC ELECTROLUMINESCENCE DISPLAY WITH FIRST ELECTRODE WITH A CURVED PORTION BELOW LIGHT BLOCKING LAYER

(71) Applicant: SAMSUNG DISPLAY CO., LTD., Yongin-si, Gyeonggi-do (KR)

(72) Inventors: Junhyuk Woo, Yongin-si (KR); Jeongwon Kim, Seoul (KR); Hyoeng-ki Kim, Suwon-si (KR); Kwangwoo Park, Hwaseong-si (KR); Bongyeon Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/858,115

(22) Filed: Dec. 29, 2017

(65) Prior Publication Data
US 2018/0331326 A1 Nov. 15, 2018

(30) Foreign Application Priority Data

May 15, 2017 (KR) ........................ 10-2017-0060146

(51) Int. Cl.
*H01L 29/08* (2006.01)
*H01L 21/00* (2006.01)
(Continued)

(52) U.S. Cl.
CPC ........ *H01L 51/5275* (2013.01); *H01L 27/323* (2013.01); *H01L 27/3246* (2013.01); *H01L 27/3272* (2013.01); *H01L 51/5209* (2013.01); *H01L 51/5253* (2013.01); *H01L 51/5281* (2013.01); *H01L 51/56* (2013.01); *H01L 51/5012* (2013.01); *H01L 51/5056* (2013.01); *H01L 51/5072* (2013.01);
(Continued)

(58) Field of Classification Search
CPC ............... H01L 51/5275; H01L 27/323; H01L 27/3246; H01L 27/3272; H01L 51/5209; H01L 51/5253; H01L 51/5281; H01L 51/56; H01L 51/5012; H01L 51/5072; H01L 51/5056

See application file for complete search history.

(56) References Cited

U.S. PATENT DOCUMENTS 8,330,361 B2 12/2012 Kim
8,502,444 B2 8/2013 Chu et al.
(Continued)

FOREIGN PATENT DOCUMENTS

| JP | 2014-209480 A | 11/2014 |
| KR | 10-0709194 | 4/2007 |
| KR | 10-1493021 B1 | 2/2015 |

*Primary Examiner* — Alonzo Chambliss
(74) *Attorney, Agent, or Firm* — Innovation Counsel LLP

(57) ABSTRACT

An organic electroluminescence display apparatus includes an insulating layer including a concave portion having a concave first upper surface, a first electrode including a curved electrode portion having a concave second upper surface overlapped with the concave portion, a pixel definition layer including a first opening defined therethrough to expose the second upper surface, an organic layer disposed on the first electrode, a second electrode disposed on the organic layer, and a light blocking layer including a second opening defined therethrough. The second opening has a width smaller than the first opening and overlaps with the first opening.

20 Claims, 24 Drawing Sheets

(51) Int. Cl.
*H01L 51/52* (2006.01)
*H01L 27/32* (2006.01)
*H01L 51/56* (2006.01)
*H01L 51/50* (2006.01)

(52) U.S. Cl.
CPC ...... *H01L 51/5088* (2013.01); *H01L 51/5092* (2013.01); *H01L 2227/323* (2013.01)

(56) References Cited

U.S. PATENT DOCUMENTS

| | | |
|---|---|---|
| 9,224,980 B2 | 12/2015 | Yamazaki et al. |
| 2015/0090991 A1* | 4/2015 | Ishii ................... H01L 51/525 257/40 |
| 2016/0072066 A1* | 3/2016 | Lee ................... H01L 51/0013 438/35 |
| 2017/0263896 A1* | 9/2017 | Inoue ................... H05B 33/24 |

* cited by examiner

Defocus 0um

Defocus 25um

Defocus 50um

Defocus 100um

ORGANIC ELECTROLUMINESCENCE DISPLAY WITH FIRST ELECTRODE WITH A CURVED PORTION BELOW LIGHT BLOCKING LAYER

CROSS-REFERENCE TO RELATED APPLICATION

This U.S. non-provisional patent application claims priority under 35 U.S.C. § 119 to Korean Patent Application No. 10-2017-0060146, filed on May 15, 2017, the contents of which are hereby incorporated by reference in its entirety.

BACKGROUND

1. Field of Disclosure

The present disclosure relates to an organic electroluminescence display apparatus. More particularly, the present disclosure relates to an organic electroluminescence display apparatus capable of reducing a reflectance of an external light and improving a light efficiency.

2. Description of the Related Art

Various display apparatuses, which are applied to a multimedia device, such as a television set, a mobile phone, a tablet computer, a navigation unit, a game unit, etc., have been developed. A self-emissive organic electroluminescence display apparatus is widely used as the display apparatus.

The organic electroluminescence display apparatus recombines holes and electrons, which are respectively injected from a first electrode and a second electrode, in a light emitting layer to emit a light, and thus an image is displayed. However, a light from the outside of the organic electroluminescence display apparatus is reflected by a metal layer of the first and second electrodes included in a light emitting element of the organic electroluminescence display apparatus, and a display image quality of the organic electroluminescence display apparatus is lowered due to the reflection of the external light. To prevent the reflection of the external light, a polarizing member obtained by coupling a polarizer to a retarder is applied to the organic electroluminescence display apparatus.

SUMMARY

The present disclosure provides an organic electroluminescence display apparatus capable of improving reflection preventing characteristics and increasing a light efficiency.

Embodiments of the inventive concept provide an organic electroluminescence display apparatus including an insulating layer including a concave portion having a concave first upper surface, a first electrode disposed on the insulating layer and including a curved electrode portion having a concave second upper surface overlapped with the concave portion, a pixel definition layer disposed on the insulating layer and including a first opening defined therethrough to expose the second upper surface, an organic layer disposed on the first electrode, a second electrode disposed on the organic layer, and a light blocking layer disposed on the second electrode and including a second opening defined therethrough. The second opening has a width smaller than the first opening and overlaps with the first opening.

The curved electrode portion satisfies the following Equation 1 of $$R_{O1} \leq \frac{W1}{2\cos\left[\tan^{-1}\left(\frac{W2}{W1-W3}\right)\right]},$$

where $R_{O1}$ denotes a radius of curvature of the second upper surface, W1 denotes a first width of the first opening, W2 denotes a second width of the second opening, and W3 denotes a shortest distance between the light blocking layer and the first electrode exposed through the first opening.

A minimum width of the first opening is equal to or greater than a maximum width of the second opening.

An edge line of the second opening is disposed inside an edge line of the first opening when viewed in a plan view.

The organic layer includes a hole transport region, a light emitting layer, and an electron transport region, which are sequentially stacked one on another, and each of the hole transport region, the light emitting layer, and the electron transport region comprises a curved surface corresponding to the curved electrode portion.

The organic electroluminescence display apparatus further includes a protective member disposed on the light blocking layer, and the protective member includes a base adhesive layer filled in the second opening and disposed on the light blocking layer and a base layer disposed on the base adhesive layer.

The organic electroluminescence display apparatus further includes an encapsulation layer disposed between the second electrode and the light blocking layer.

The organic electroluminescence display apparatus further includes a first optical layer disposed on the light blocking layer, and the first optical layer has a first refractive index equal to or greater than a refractive index of the encapsulation layer.

The first optical layer is filled in the second opening.

The organic electroluminescence display apparatus further includes a second optical layer overlapped with the second opening, disposed between the encapsulation layer and the first optical layer, and having a second refractive index equal to or smaller than the first refractive index.

The second refractive index is equal to the refractive index of the encapsulation layer.

The curved electrode portion satisfies the following Equation 2 of $$R_{O2} \leq \frac{W1}{2\cos\left[\tan^{-1}\left(\frac{W3}{W1}\right)\right]},$$

where $R_{O2}$ denotes a radius of curvature of the second upper surface, W1 denotes a first width of the first opening, and W3 denotes a shortest distance between the light blocking layer and the first electrode exposed through the first opening.

The second optical layer is filled in the second opening and partially overlapped with the light blocking layer.

The second optical layer includes a curved portion convex toward the first optical layer direction.

The second upper surface has a radius of curvature equal to a radius of curvature of the convex curved portion.

The organic electroluminescence display apparatus further includes a polarizing layer disposed on the light blocking layer, and the polarizing layer includes a λ/4 retarder and a linear polarizing layer disposed on the λ/4 retarder.

The organic electroluminescence display apparatus further includes an input sensing unit disposed between the second electrode and the light blocking layer.

Embodiments of the inventive concept provide an organic electroluminescence display apparatus including a display panel and a light blocking member disposed on the display panel. The display panel includes a substrate, a first electrode including a curved surface convex toward the substrate, a pixel definition layer disposed on the substrate and including a first opening defined therethrough to expose the first electrode, at least one organic layer disposed on the first electrode, a second electrode disposed on the at least one organic layer, and an encapsulation layer disposed on the second electrode. The light blocking member includes a light blocking layer having a second opening defined through the light blocking layer, and the second opening has a width smaller than the first opening and is overlapped with the first opening.

The light blocking member further includes an optical layer disposed on the light blocking layer and having a refractive index equal to or greater than a refractive index of the encapsulation layer.

The light blocking member further includes an optical layer disposed on the light blocking layer and having a first refractive index and a lens part filled in the second opening, disposed between the encapsulation layer and the optical layer, having a curved surface convex toward the optical layer, and having a refractive index equal to or smaller than the first refractive index.

According to the above, the light blocking layer is disposed on the display panel to effectively block the external light traveling to the display panel, and thus the display quality of the organic electroluminescence display apparatus may be improved.

The organic electroluminescence display apparatus includes the display panel having the electrode provided with the concave curved surface and the light blocking layer disposed on the display panel. Thus the reflectance of the external light may be reduced, and the light extraction efficiency of the organic electroluminescence display apparatus may be improved.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
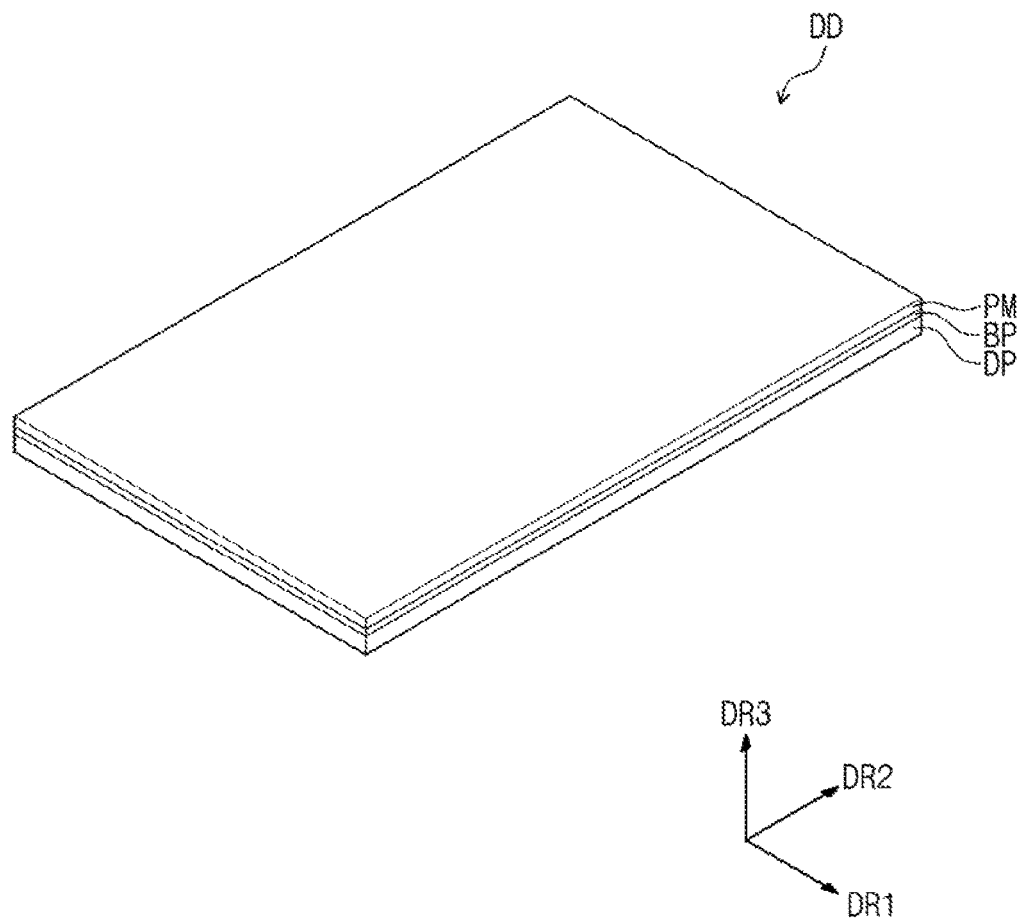
FIG. 1 is a perspective view showing an organic electroluminescence display apparatus according to an exemplary embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure.

Like numerals refer to like elements throughout. In the drawings, the thickness of layers, films, and regions are exaggerated for clarity. The use of the terms first, second, etc. do not denote any order or importance, but rather the terms first, second, etc. are used to distinguish one element from another. Thus, a first element, component, region, layer or section discussed below could be termed a second element, component, region, layer or section without departing from the teachings of the present disclosure. It is to be understood that the singular forms "a," "an," and "the" include plural referents unless the context clearly dictates otherwise.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Further, it will be understood that when an element or layer is referred to as being "on" in the present application may include the case where it is disposed on the lower part as well as on the upper part of the other element.

Hereinafter, the present inventive concept will be explained in detail with reference to the accompanying drawings.

FIG. 1 is a perspective view showing an organic electroluminescence display apparatus DD according to an exemplary embodiment of the present disclosure. The organic electroluminescence display apparatus DD includes a display panel DP, a light blocking member BP disposed on the display panel DP, and a protective member PM disposed on the light blocking member BP.

In the present exemplary embodiment, the display panel DP may be, but not limited to, an organic electroluminescence display panel. The light blocking member BP may block an external light traveling to the display panel DP from the outside of the display panel DP. The protective member PM may be, but not limited to, a supporter to support the display panel DP or a window member to protect the display panel DP.

Figure 2:
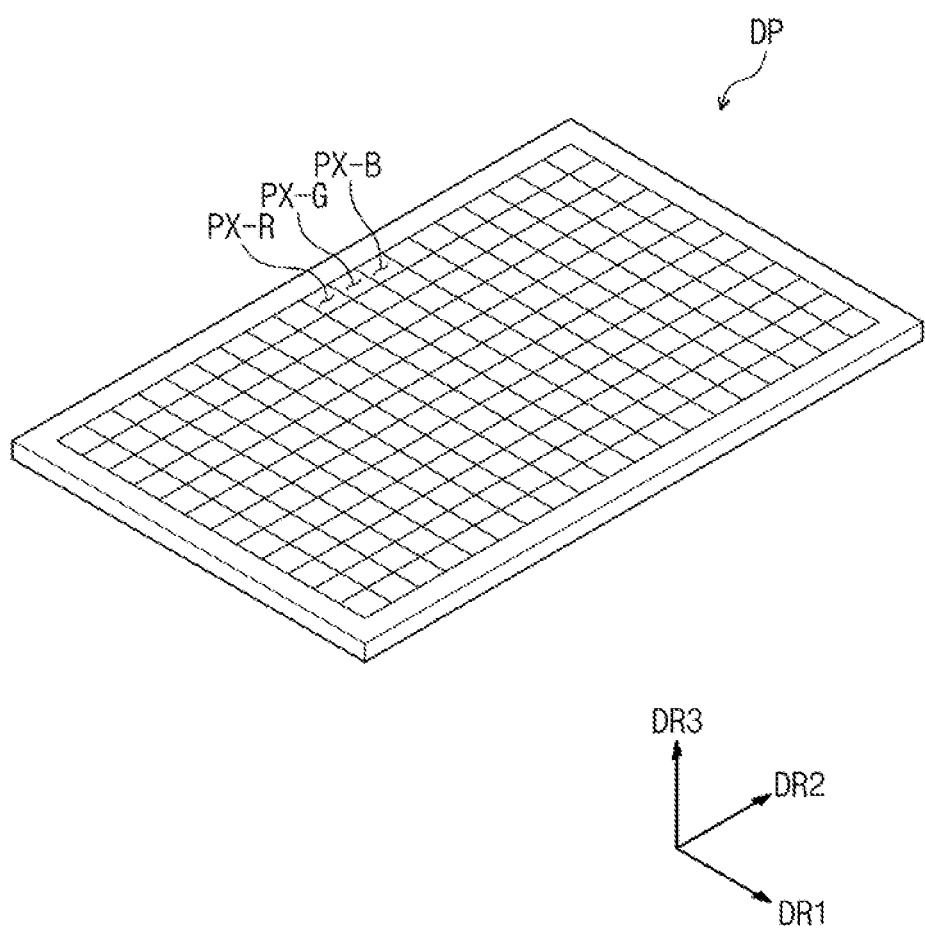
FIG. 2 is a perspective view showing a display panel included in an organic electroluminescence display apparatus according to an exemplary embodiment of the present disclosure.

FIG. 2 is a perspective view showing the display panel DP included in the organic electroluminescence display apparatus DD according to an exemplary embodiment of the present disclosure. As shown in FIG. 2, the display panel DP includes a plurality of pixels PX-R, PX-G, and PX-B. FIG. 2 shows three kinds of pixels PX-R, PX-G, and PX-B, and the three pixels PX-R, PX-G, and PX-B may generate different color lights from each other. For instance, the three pixels PX-R, PX-QG and PX-B may emit a red light, a green light, and a blue light, respectively. The three pixels PX-R, PX-G, and PX-B may emit a magenta light, a yellow light, and a cyan light, respectively. The three pixels PX-R, PX-G, and PX-B may emit the light to a third direction DR3 of FIG. 2.

For instance, the three pixels PX-R, PX-G, and PX-B may be arranged in a matrix form on a plane defined by an axis corresponding to a first direction DR1 and an axis corresponding to a second direction DR2. In addition, the three pixels PX-R, PX-G and PX-B may be arranged in different columns along the first direction DR1, but they should not be limited thereto or thereby. The arrangement of the pixels may vary in various ways according to an implementation of the display panel.

The pixel according to the exemplary embodiment of the present disclosure may correspond to an organic electroluminescence device described later. In addition, the three pixels PX-R, PX-C, and PX-B may respectively correspond to organic electroluminescence devices having light emitting layers emitting lights with different wavelength regions.

Figure 3:
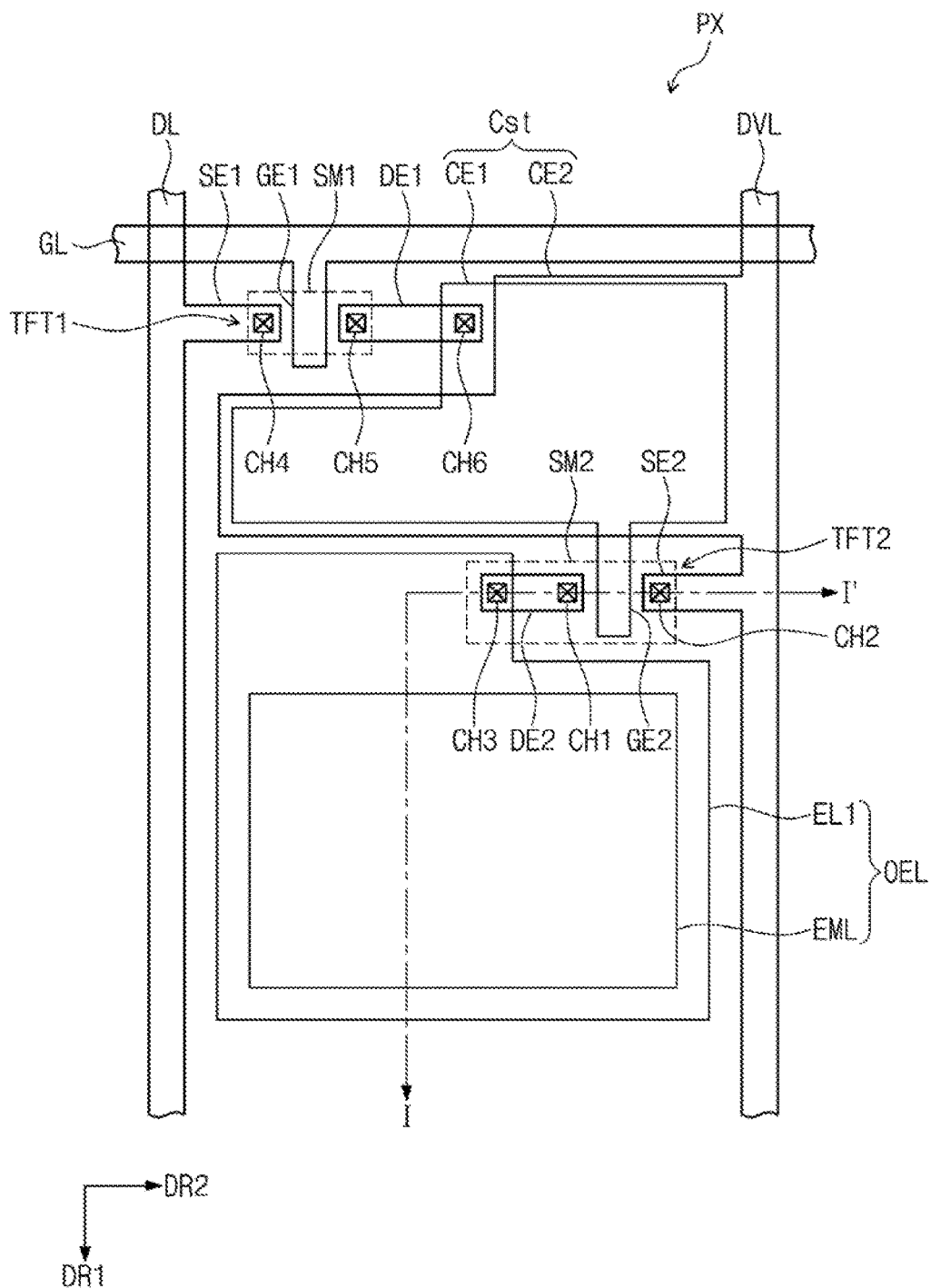
FIG. 3 is a plan view showing a pixel among pixels included in a display panel of an organic electroluminescence display apparatus according to an exemplary embodiment of the present disclosure.
Figure 4:
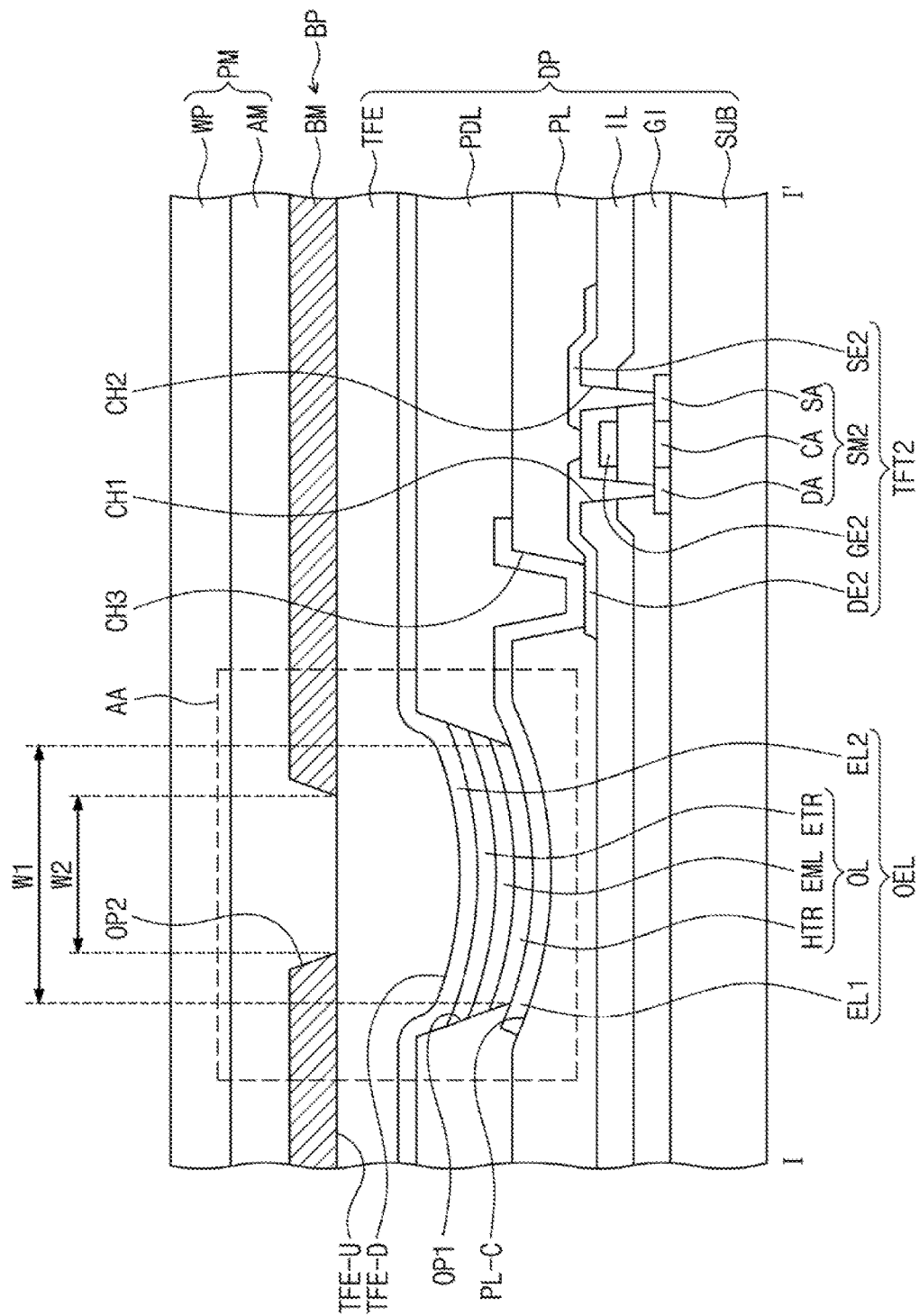
FIG. 4 is a cross-sectional view taken along a line I-I' of FIG. 3.

FIG. 3 is a plan view showing a pixel among pixels included in the display panel DP (refer to FIG. 2) of the organic electroluminescence display apparatus according to an exemplary embodiment of the present disclosure. FIG. 4 is a cross-sectional view taken along a line I-I' of FIG. 3.

Figure 5A:
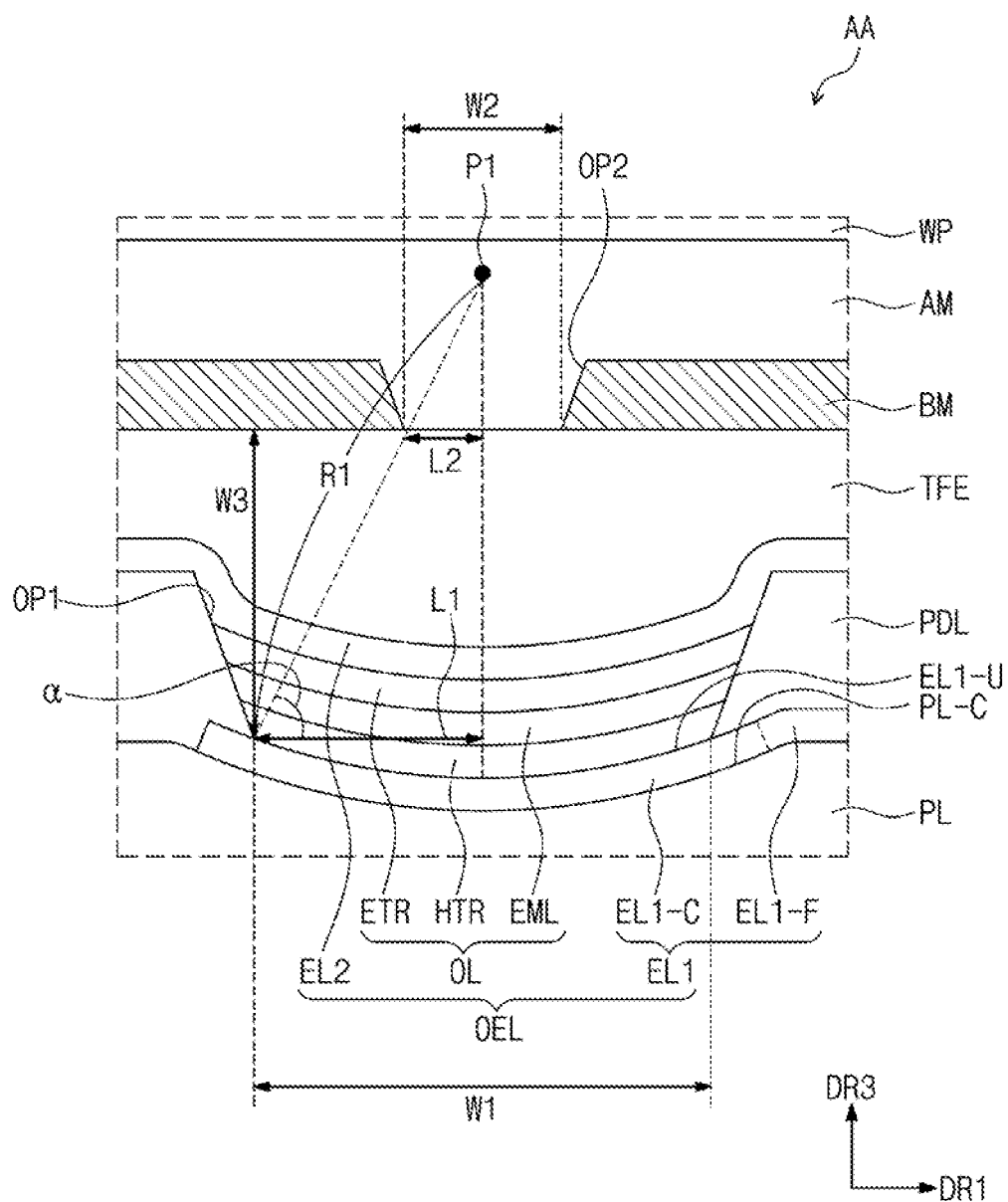
FIG. 5A is a cross-sectional view showing an area AA of FIG. 4.
Figure 5B:
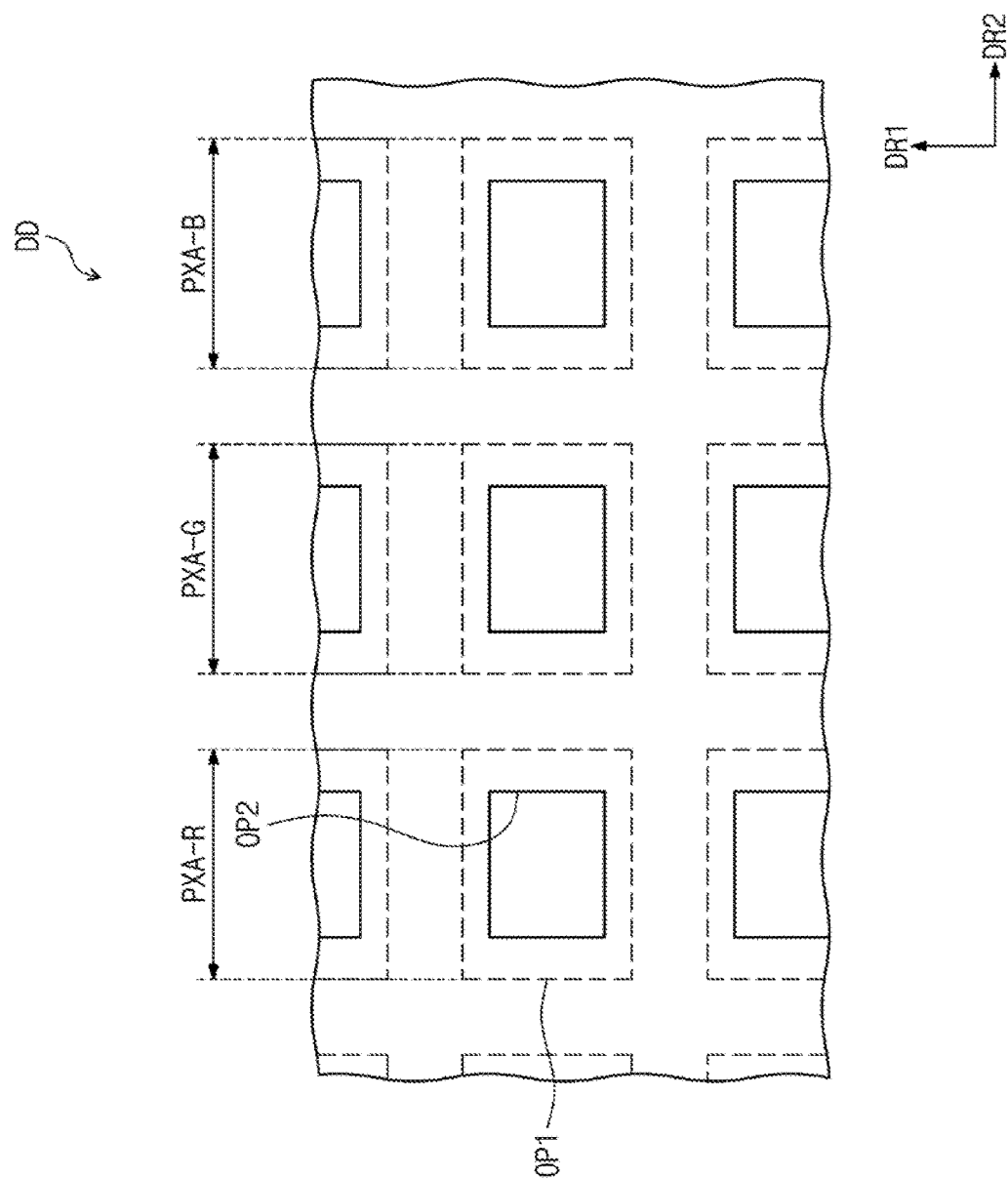
FIG. 5B is a plan view showing an organic electroluminescence display apparatus according to an exemplary embodiment of the present disclosure.

FIG. 5A is a cross-sectional view showing an area AA of FIG. 4. FIG. 5B is a plan view showing an organic electroluminescence display apparatus according to an exemplary embodiment of the present disclosure.

The pixel PX of FIG. 3 may correspond to one of the three pixels PX-R, PX-G, and PX-B of the display panel DP shown in FIG. 2. The pixel PX may be connected to a line part including a gate line GL, a data line DL, and a driving voltage line DVL. The pixel PX includes thin film transistors TFT1 and TFT2 connected to the line part, an organic electroluminescence device OEL connected to the thin film transistors TFT1 and TFT2, and a capacitor Cst.

In the exemplary embodiment, one pixel PX is connected to one gate line GL, one data line DL, and one driving voltage line DVL, but according to other embodiments, plural pixels may be connected to one gate line GL, one data line DL, and one driving voltage line DVL. In addition, one pixel PX may be connected to at least one gate line GL, at least one data line DL, and at least one driving voltage line DVL.

The data line DL extends in the first direction DR1. The gate line GL extends in the second direction DR2 to cross the data line DL. The driving voltage line DVL extends in the same direction as the data line DL, i.e., the first direction DR1. The gate line GL applies a scan signal to the thin film transistors TFT1 and TFT2, the data line DL applies a data signal to the thin film transistors TFT1 and TFT2, and the driving voltage line DVL applies a driving voltage to the thin film transistors TFT1 and TFT2.

The thin film transistors TFT1 and TFT2 may include a driving thin film transistor TFT2 to control the organic electroluminescence device OEL and a switching thin film transistor TFT1 to switch the driving thin film transistor TFT2. In the exemplary embodiment of the present disclosure, one pixel PX include two thin film transistors TFT1 and TFT2, but it should not be limited thereto or thereby. That is, according to other embodiments, one pixel PX may include one thin film transistor and a capacitor or one pixel PX may include three or more thin film transistors and two or more capacitors.

The switching thin film transistor TFT1 includes a first gate electrode GE1, a first source electrode SE, and a first drain electrode DE1. The first gate electrode GE1 is connected to the gate line GL, and the first source electrode SE1 is connected to the data line DL. The first drain electrode DE1 is connected to a first common electrode CE1 through a fifth contact hole CH5. The switching thin film transistor TFT1 applies the data signal applied thereto through the data line DL to the driving thin film transistor TFT2 in response to the scan signal applied thereto through the gate line GL. The driving thin film transistor TFT2 includes a second gate electrode GE2, a second source electrode SE2, and a second drain electrode DE2. The second gate electrode GE2 is connected to the first common electrode CE1. The second source electrode SE2 is connected to the driving voltage line DVL. The second drain electrode DE2 is connected to a first electrode EL1 through a third contact hole CH3.

The first electrode EL1 is connected to the second drain electrode DE2 of the driving thin film transistor TFT2. A common voltage is applied to a second electrode (not shown), and a light emitting layer EML emits a blue light in response to an output signal of the driving thin film transistor TFT2, thereby displaying an image. The first electrode EL1, the second electrode, and the light emitting layer EML will be described in detail later.

The capacitor Cst is connected between the second gate electrode GE2 and the second source electrode SE2 of the driving thin film transistor TFT2 and charged with a voltage corresponding to the data signal input through the second gate electrode GE2 of the driving thin film transistor TFT2 to maintain the charged voltage. The capacitor Cst may include the first common electrode CE1 connected to the first drain electrode DE1 through a sixth contact hole CH6 and a second common electrode CE2 connected to the driving voltage line DVL.

Referring to FIG. 4, the display panel DP may include a pixel definition layer PDL to define the organic electroluminescence device OEL and a light emitting area of the organic electroluminescence device OEL. The display panel DP includes a substrate SUB, and the organic electroluminescence device OEL is disposed on the substrate SUB. In addition, the display panel DP may further include an encapsulation layer TFE disposed on the organic electroluminescence device OEL.

A material for the substrate SUB should not be particularly limited and the substrate SUB may be a flexible substrate. The substrate SUB may be a glass substrate or a plastic substrate formed of a polymer resin. For instance, the substrate SUB may include polyethylene terephthalate (PET), polyethylene naphthalate (PEN), polyimide, polyether sulfone, and the like. The material for the substrate SUB may be selected by taking into account a mechanical strength, a thermal stability, a transparency, a surface smoothness, an ease of handling, a water repellency, etc. The substrate SUB may be transparent, but it should not be limited thereto or thereby.

A substrate buffer layer (not shown) may be provided on the substrate SUB. The substrate buffer layer (not shown) prevents impurities from diffusing into the switching thin film transistor TFT1 and the driving thin film transistor TFT2. The substrate buffer layer (not shown) may be formed of silicon nitride (SiNx), silicon oxide (SiOx), silicon oxynitride (SiOxNy), or the like and omitted depending on the material of the substrate SUB and a process condition.

A first semiconductor pattern SM1 and a second semiconductor pattern SM2 are disposed on the substrate SUB. The first semiconductor pattern SM1 and the second semiconductor pattern SM2 are formed of a semiconductor material and operated as active layers of the switching thin film transistor TFT1 and the driving thin film transistor TFT2, respectively. Each of the first semiconductor pattern SM1 and the second semiconductor pattern SM2 includes a source part SA, a drain part DA, and a channel part CA defined between the source part SA and the drain part DA. Each of the first semiconductor pattern SM1 and the second semiconductor pattern SM2 may be formed of an inorganic semiconductor or an organic semiconductor. The source part SA and the drain part DA may be doped with an n-type impurity or a p-type impurity depending on majority carriers of the TFT.

A gate insulating layer GI is disposed on the first semiconductor pattern SM1 and the second semiconductor pattern SM2. The gate insulating layer GI covers the first semiconductor pattern SM1 and the second semiconductor pattern SM2. The gate insulating layer GI may include an organic insulating material or an inorganic insulating material.

The first gate electrode GE1 and the second gate electrode GE2 are disposed on the gate insulating layer GI. The first gate electrode GE1 and the second gate electrode GE2 are formed to cover areas corresponding to the channel part CA of the first semiconductor pattern SM1 and the second semiconductor pattern SM2.

An inter-insulating layer IL is disposed on the first gate electrode GE1 and the second gate electrode GE2. The inter-insulating layer IL covers the first gate electrode GE1 and the second gate electrode GE2. The inter-insulating layer IL may include an organic insulating material or an inorganic insulating material.

The first source electrode SE1, the first drain electrode DE1, the second source electrode SE2, and the second drain electrode DE2 are disposed on the inter-insulating layer IL. The second drain electrode DE2 makes contact with the drain part DA of the second semiconductor pattern SM2 through a first contact hole CH1 defined through the gate insulating layer GI and the inter-insulating layer IL, and the second source electrode SE2 makes contact with the source part SA of the second semiconductor pattern SM2 through a second contact hole CH2 defined through the gate insulating layer GI and the inter-insulating layer IL. The first source electrode SE1 makes contact with a source part (not shown) of the first semiconductor pattern SM1 through a fourth contact hole CH4 defined through the gate insulating layer GI and the inter-insulating layer IL, and the first drain electrode DE1 makes contact with a drain part (not shown) of the first semiconductor pattern SM1 through the fifth contact hole CH5 defined through the gate insulating layer GI and the inter-insulating layer IL.

An insulating layer PL is disposed on the substrate SUB. The insulating layer PL may be disposed on the first source electrode SE1, first drain electrode DE1, the second source electrode SE2, and the second drain electrode DE2. In the organic electroluminescence display apparatus according to the exemplary embodiment, the insulating layer PL may include a concave portion PL-C in a region corresponding to the organic electroluminescence device OEL.

The concave portion PL-C of the insulating layer PL may be convex toward the substrate SUB. The concave portion PL-C of the insulating layer PL may be a portion, which is recessed toward the substrate SUB, of an upper surface of the insulating layer PL. A portion of the insulating layer PL may be the concave portion PL-C having a convex surface convex toward the substrate SUB. The concave portion PL-C of the insulating layer PL may be a spherical surface convex toward the substrate SUB. The concave portion PL-C of the insulating layer PL may be a spherical surface having a radius of curvature with respect to an imaginary center of curvature disposed above the upper surface of the insulating layer PL.

Meanwhile, FIGS. 4 and 5A show one pixel area corresponding to one pixel PX (refer to FIG. 3) as a representative example, but the insulating layer PL may include a plurality of concave portions PL-C respectively corresponding to a plurality of pixel areas. In addition, FIG. 5A shows a cross-section substantially parallel to a surface defined by the axis corresponding to the first direction DR1 and an axis corresponding to the third direction DR3 as a representative example, however, the concave portion PL-C of the insulating layer PL may be recessed toward the substrate SUB to have a concave upper surface when viewed in a cross-sectional view substantially parallel to a surface defined by the axis corresponding to the second direction DR2 and the axis corresponding to the third direction DR3.

The insulating layer PL may serve as a protective layer to protect the switching thin film transistor TFT1 and the driving thin film transistor TFT2. In addition, the insulating layer PL may serve as a planarization layer to planarize an upper surface on which the switching thin film transistor TFT1 and the driving thin film transistor TFT2 are disposed. For instance, referring to FIG. 4, the insulating layer PL may serve as the planarization layer having the planarized upper surface in an area except for the concave portion PL-C of the insulating layer PL and the third contact hole CH3.

The organic electroluminescence device OEL including the first electrode EL1, an organic layer OL, and the second electrode EL2, which are sequentially stacked in the third direction DR3, may be disposed on the insulating layer PL. The organic layer OL of the organic electroluminescence device OEL may include a plurality of layers, and for example, the organic layer OL may include a hole transport region HTR, the light emitting layer EML, and an electron transport region ETR. The organic layer OL may be disposed in a first opening OP1 described later.

The first electrode EL1 of the organic electroluminescence device OEL may be disposed on the insulating layer PL. The first electrode EL1 has conductivity. The first electrode EL1 may include a metal alloy or a conductive compound. The first electrode EL1 may be an anode. The first electrode EL1 may be a pixel electrode. The first electrode EL1 is connected to the second drain electrode DE2 of the driving thin film transistor TFT2 through the third contact hole CH3 defined through the insulating layer PL.

The first electrode EL1 of the display panel DP of the organic electroluminescence display apparatus according to the exemplary embodiment may be a reflective type electrode, but it should not be limited to the reflective type electrode. As an example, the first electrode EL1 may be a transmissive type electrode or a transflective type electrode. When the first electrode EL1 is the transflective type electrode or the reflective type electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound thereof or a mixture thereof (for example, a mixture of Ag and Mg). In addition, the first electrode EL1 may have a multi-layer structure of a reflective layer or a transflective layer, which is formed of the above-mentioned materials, and a transparent conductive layer formed of indium tin oxide (ITO), indium zinc oxide (IZO), zinc oxide (ZnO), indium tin zinc oxide (ITZO), etc.

The first electrode EL1 may include a curved electrode portion EL1-C disposed in the concave portion PL-C of the insulating layer PL and having a concave upper surface EL1-U. That is, the first electrode EL1 may include the curved electrode portion EL1-C disposed on the concave portion PL-C and having the concave upper surface EL1-U with a curved surface corresponding to the concave portion PL-C of the insulating layer PL. The curved electrode portion EL1-C of the first electrode EL1 may be formed along the curved surface of the concave portion PL-C. The concave upper surface EL1-U of the first electrode EL1 may have a radius of curvature corresponding to a radius of curvature of the upper surface of the concave portion PL-C, but it should not be limited thereto or thereby. That is, the radius of curvature of the concave upper surface EL1-U of the first electrode EL1 may be smaller than the radius of curvature of the upper surface of the concave portion PL-C.

The first electrode EL1 may include the curved electrode portion EL1-C disposed corresponding to the concave portion PL-C of the insulating layer PL-C and a flat electrode portion EL1-F extending from one end of the curved electrode portion EL1-C.

The pixel definition layer PDL may be disposed on the insulating layer PL. The pixel definition layer PDL may define the first opening OP1 in the concave portion PL-C to expose the first electrode EL1.

The pixel definition layer PDL may divide the organic layer OL into plural portions respectively corresponding to the pixels PX. The first opening OP1 of the pixel definition layer PDL may expose the concave upper surface EL1-U of the first electrode EL1 disposed in the concave portion PL-C.

The pixel definition layer PDL may include a polymer resin. For instance, the pixel definition layer PDL may include a polyacrylate-based resin or a polyimide-based resin. In addition, the pixel definition layer PDL may further include an inorganic material in addition to the polymer resin. Meanwhile, the pixel definition layer PDL may include a light absorbing material, a black pigment, or a black dye. The pixel definition layer PDL including the black pigment or the black dye may be formed as a black pixel definition layer. When the pixel definition layer PDL is formed, a carbon black may be used as the black pigment or the black dye, but it should not be limited thereto or thereby.

The organic layer OL may be disposed on the first electrode EL1. The organic layer OL may be disposed in the first opening OP1. The organic layer OL may include the hole transport region HTR disposed on the first electrode EL1, the light emitting layer EML disposed on the hole transport region HTR, and the electron transport region ETR disposed on the light emitting layer EML.

The hole transport region HTR may have a single-layer structure of a single material, a single-layer structure of different materials from each other, or a multi-layer structure of plural layers including different materials from each other. For instance, the hole transport region HTR may have the single-layer structure of different materials from each other or a structure of a hole injection layer/a hole transport layer, the hole injection layer/the hole transport layer/a buffer layer, the hole injection layer/the buffer layer, the hole transport layer/the buffer layer, or the hole injection layer/the hole transport layer/an electron block layer, each of which are sequentially stacked from the first electrode EL1, but it should not be limited thereto or thereby.

For instance, the hole transport region HTR may include the hole injection layer and the hole transport layer, and a well-known hole injection material and a well-known hole transport material may be used to form the hole injection layer and the hole transport layer, respectively.

The light emitting layer EML is disposed on the hole transport region HTR. The light emitting layer EML may have a single-layer structure of a single material, a single-layer structure of different materials from each other, or a multi-layer structure of plural layers including different materials from each other.

The light emitting layer EML should not be limited to a certain material. For example, the light emitting layer EML may include materials emitting red, green, and blue color lights. To this end, the light emitting layer EML may include a fluorescent material or a phosphorescent material. In addition, the light emitting layer EML may include a host and a dopant.

The electron transport region ETR is disposed on the light emitting layer EML. The electron transport region ETR may include at least one of a hole blocking layer, an electron transport layer, and an electron injection layer, but it should not be limited thereto or thereby.

In a case that the electron transport region ETR includes the electron injection layer and the electron transport layer, a well-known electron injection material and a well-known electron transport material may be used to form the electron injection layer and the electron transport layer, respectively.

The second electrode EL2 is disposed on the electron transport region ETR. The second electrode EL2 may serve as a common electrode or a cathode. The second electrode EL2 may include a metal alloy or a conductive compound. The second electrode EL2 may be a transmissive type electrode, a transflective type electrode, or a reflective type electrode. When the second electrode EL2 is the transmissive type electrode, the second electrode EL2 may include a transparent metal oxide, e.g., indium tin oxide (ITO), indium zinc oxide (IZO), zinc oxide (ZnO), indium tin zinc oxide (ITZO), etc.

When the second electrode EL2 is the transflective type electrode or the reflective type electrode, the second electrode EL2 may include Ag, Mg, Cu, Al, Pt, Pd, Au, Ni, Nd, Ir, Cr Li, Ca, LiF/Ca, LiF/Al, Mo, Ti, or a compound thereof or a mixture thereof (for example, a mixture of Ag and Mg). In addition, the second electrode EL2 may have a multi-layer structure of a reflective layer or a transflective layer, which is formed of the above-mentioned materials, and a transparent conductive layer formed of indium tin oxide (ITO), indium zinc oxide (IZO), zinc oxide (ZnO), indium tin zinc oxide (ITZO), etc.

Although not shown in figures, the second electrode EL2 may be connected to an auxiliary electrode. When the second electrode EL2 is connected to the auxiliary electrode, a resistance of the second electrode EL2 may be reduced.

In the exemplary embodiment, the first electrode EL1 and the second electrode EL2 may face each other with the organic layer OL disposed therebetween. The first electrode EL1 may be the reflective type electrode and the second electrode EL2 may be the transparent type electrode, but they should not be limited thereto or thereby.

The upper surface EL1-U of the first electrode EL1, the upper surface of the organic layer OL, and the upper surface of the second electrode EL2, which form the organic electroluminescence device OEL and are disposed in the first opening OP1, may have the concave surfaces. That is, the first electrode EL1, the organic layer OL, and the second electrode EL2 may be formed to have the curved surface corresponding to the concave portion PL-C of the insulating layer PL.

Meanwhile, the second electrode EL2 may be disposed on the organic layer OL and the pixel definition layer PDL. A portion of the second electrode EL2, which is disposed to overlap with the organic layer OL, may have the concave upper surface, and a portion of the second electrode EL2, which is disposed on the pixel definition layer PDL, may have a flat upper surface.

In the organic electroluminescence display apparatus according to the exemplary embodiment, the organic electroluminescence device OEL may include the first electrode EL1 having the concave curved surface, and thus the organic electroluminescence device OEL may condense a light generated from the organic electroluminescence device OEL to allow the light to be emitted to the outside of the organic electroluminescence device OEL.

The encapsulation layer TFE may be disposed on the second electrode EL2. The encapsulation layer TFE may be disposed to cover the second electrode EL2. The encapsulation layer TFE may have a single-layer structure or a multi-layer structure. The encapsulation layer TFE may include at least one layer of an organic layer and an inorganic layer. The encapsulation layer TFE may have a multi-layered structure which includes at least one organic layer and at least one inorganic layer.

The encapsulation layer TFE may be, for example, a thin film encapsulation 1.5 layer. The encapsulation layer TFE protects the organic electroluminescence device OEL. A black printed layer (not shown) may be partially disposed on one surface of the encapsulation layer TFE. For instance, the black printed layer (not shown) may be disposed on one surface of the encapsulation layer TFE adjacent to the second electrode EL2, and the black printed layer may be disposed on the pixel definition layer PDL, but it should not be limited thereto or thereby. The black printed layer may be printed on one surface of the encapsulation layer TFE which is exposed without making contact with the second electrode EL2. The black printed layer may be mainly disposed in an area in which the organic electroluminescence device OEL is not disposed. Meanwhile, the encapsulation layer TFE may be omitted, and a separate encapsulation member may be added to the organic electroluminescence device OEL.

The encapsulation layer TFE may fill the first opening OP1 to cover the upper surface of the second electrode EL2 disposed in the first opening OP. A lower surface TFE-D of the encapsulation layer TFE may have a curvature corresponding to the upper surface of the second electrode EL2, and an upper surface TFE-U of the encapsulation layer TFE may be flat. As an example, the encapsulation layer TFE may be disposed on the organic electroluminescence device OEL to serve as a planarization layer.

A light blocking layer BM though which a second opening OP2 is defined may be disposed above the organic electroluminescence device OEL. The light blocking layer BM may be a black matrix. The light blocking layer BM may include an organic light blocking material or an inorganic light blocking material, which contains a black pigment or dye. Meanwhile, the light blocking layer BM may be disposed on the encapsulation layer TFE. The light blocking layer BM may be the light blocking member BP that blocks the light traveling to the organic electroluminescence display apparatus DD from the outside. In addition, the light blocking layer BM may block lights reflected by the electrodes EL1 and EL2 of the organic electroluminescence device OEL or the thin film transistors TFT1 and TFT2 of the display panel DP to prevent a light leakage phenomenon from occurring.

The second opening OP2 may be defined through the light blocking layer BM to overlap the first opening OP1 in a plan view. The second opening OP2 has a width W2 smaller than a width W1 of the first opening OP1. The second opening OP2 may be defined to overlap with the first opening OP1. In FIGS. 4 and 5A, W1 and W2 respectively denote minimum widths of the first and the second openings OP1 and OP2, but a maximum width of the second opening OP2 may be smaller than the minimum width of the first opening OP1.

The width W1 of the first opening OP1 may be adjusted by taking into account a resolution of the organic electroluminescence display apparatus, and the width W1 of the first opening OP1 may be varied for each pixel. The width W2 of the second opening OP2 is required to be smaller than the width W1 of the first opening OP1, and for example, the width W2 of the second opening OP2 is required to be smaller than about 90% of the width W1 of the first opening OP1. In detail, in a case that the width W1 of the first opening OP1 of the pixel emitting the blue light is about 17 micrometers (μm), the width W2 of the second opening OP2 may be equal to or greater than about 4 micrometers (μm) and equal to or smaller than about 8 micrometers (tan). However, the width of the first and second openings OP1 and OP2 may be changed depending on a design of the organic electroluminescence display apparatus, a type of the pixels, the resolution, and so on.

In addition, as shown in FIG. 4, since the width of the first and second openings OP1 and OP2 gradually increases in the third direction DR3, i.e., the thickness direction of the organic electroluminescence display apparatus, side surfaces defining the first and second openings OP1 and OP2 are provided with slanted surfaces when viewed in a cross section, but they should not be limited thereto or thereby.

In the organic electroluminescence display apparatus according to the exemplary embodiment, a color filter layer is not disposed in the second opening OP2 defined through the light blocking layer BM. That is, since the width W2 of the second opening OP2 defined through the light blocking layer BM of the organic electroluminescence display apparatus is smaller than the width W1 of the first opening OP1 defining the light emitting area of the pixel, the external light may be effectively blocked without providing the color filter layer to the light blocking member.

In the organic electroluminescence display apparatus according to the exemplary embodiment, the protective member PM may further be disposed on the light blocking layer BM. The protective member PM may include a base layer WP and a base adhesive layer AM attaching the base layer WP to the light blocking layer BM.

Meanwhile, in the exemplary embodiment shown in FIG. 4, the base adhesive layer AM may be disposed to fill the second opening OP2. The encapsulation layer TFE exposed through the second opening OP2 may make contact with the base adhesive layer AM in the second opening OP2. That is, a lower surface of the base adhesive layer AM may make contact with the upper surface of the encapsulation layer TFE in the second opening OP2.

The base adhesive layer AM may be, but not limited to, a transparent adhesive layer. The base layer WP may be a glass substrate or a plastic substrate. In addition, the base layer WP may be a film layer formed of a polymer material.

FIG. 5A shows the cross-sectional view of the area AA of FIG. 4. In FIG. 5A, the upper surface EL1-U of the curved electrode portion EL1-C has a radius of curvature R1. In FIG. 5A, P1 denotes a virtual point indicating a center of the radius of curvature R1 of the curved electrode portion EL1-C of the first electrode EL1.

In FIG. 5A, the curved electrode portion EL1-C of the first electrode EL1 may satisfy the following Equation 1.

$$R_{O1} \leq \frac{W1}{2\cos\left[\tan^{-1}\left(\frac{W2}{W1-W3}\right)\right]} \quad \text{Equation 1}$$

In Equation 1, $R_{O1}$ denotes the radius of curvature of the upper surface EL1-U of the curved electrode portion EL1-C, W1 denotes the width of the first opening P1, W2 denotes the width of the second opening OP2, and W3 denotes a shortest distance between the light blocking layer BM and the first electrode EL1 exposed through the first opening OP1.

In FIG. 5A, L1 denotes a distance between one end of the first opening OP1 defined by the pixel definition layer PDL and a center of the first opening OP1 and corresponds to a half of the width W1 of the first opening OP1. In addition, L2 denotes a distance between one end of the second opening OP2 defined by the light blocking layer BM and a center of the second opening OP2 and corresponds to a half of the width W2 of the second opening OP2.

In FIG. 5A, an angle α may be represented by the following Equation 1-1.

$$\alpha = \tan^{-1}\left(\frac{W3}{\frac{W1}{2}-\frac{W2}{2}}\right) \quad \text{Equation 1-1}$$

In addition, the radius of the curvature of the curved electrode portion EL1-C may be represented by the following Equation 1-2.

$$R_{O1} \leq \frac{\frac{W1}{2}}{\cos\alpha} \quad \text{Equation 1-2}$$

Accordingly, Equation 1 may be derived from Equations 1-1 and 1-2. That is, the radius of curvature R1 of the upper surface EL1-U of the curved electrode portion EL1-C may satisfy the following Equation 1-3.

$$R1 \leq \frac{W1}{2\cos\left[\tan^{-1}\left(\frac{W2}{W1-W3}\right)\right]} \quad \text{Equation 1-3}$$

Referring to Equation 1-3, the radius of curvature of the concave upper surface EL1-U of the first electrode EL1 may be varied depending on the width W1 of the first opening, the width W2 of the second opening, and the distance between the first electrode EL1 and the light blocking layer BM.

FIG. 5B is a plan view showing a portion of an organic electroluminescence display apparatus DD according to an exemplary embodiment of the present disclosure. FIG. 5B shows three kinds of light emitting areas PXA-R, PXA-G, and PXA-B arranged in a matrix form as a representative example. The organic electroluminescence devices included in the pixels PX-R, PX-G, and PX-B of the display panel DP shown in FIG. 2 may be respectively disposed in the light emitting areas PXA-R, PXA-CG, and PXA-B.

FIG. 5B is a view explaining relative size and location between the first opening OP1 of the pixel definition layer PDL and the second opening OP2 of the light blocking layer BM. Referring to FIG. 5B, the first opening OP1 has the width greater than that of the second opening OP2, and an area of the first opening OP1 is greater than that of the second opening OP2 when viewed in a plan view. In addition, according to the organic electroluminescence display apparatus according to the exemplary embodiment, an edge line of the second opening OP2 may be placed inside an edge line of the first opening OP1.

Meanwhile, the first and second openings OP1 and OP2 have a rectangular shape as shown in FIG. 5B, but the shape of the first and second openings OP1 and OP2 should not be limited to the rectangular shape. The first and second openings OP1 and OP2 may have various shapes. For instance, each of the first opening OP1 and the second opening OP2 may have an oval shape or a circular shape when viewed in a plan view. In addition, each of the first opening OP1 and the second opening OP2 may have a shape including a curved portion and a straight portion when viewed in a plan view.

In a plan view, the second opening OP2 entirely overlaps with the first opening OP1, and the first opening OP1 includes a portion that does not overlap with the second opening OP2.

Hereinafter, an organic electroluminescence display apparatus according to an exemplary embodiment will be described with reference to FIGS. 6A to 16. In FIGS. 6A to 16, different features of the organic electroluminescence display apparatus from those of the organic electroluminescence display apparatus described with reference to FIGS. 1 to 5B will be mainly described, and thus, elements that are identical or similar will not be re-described.

Figure 6A:
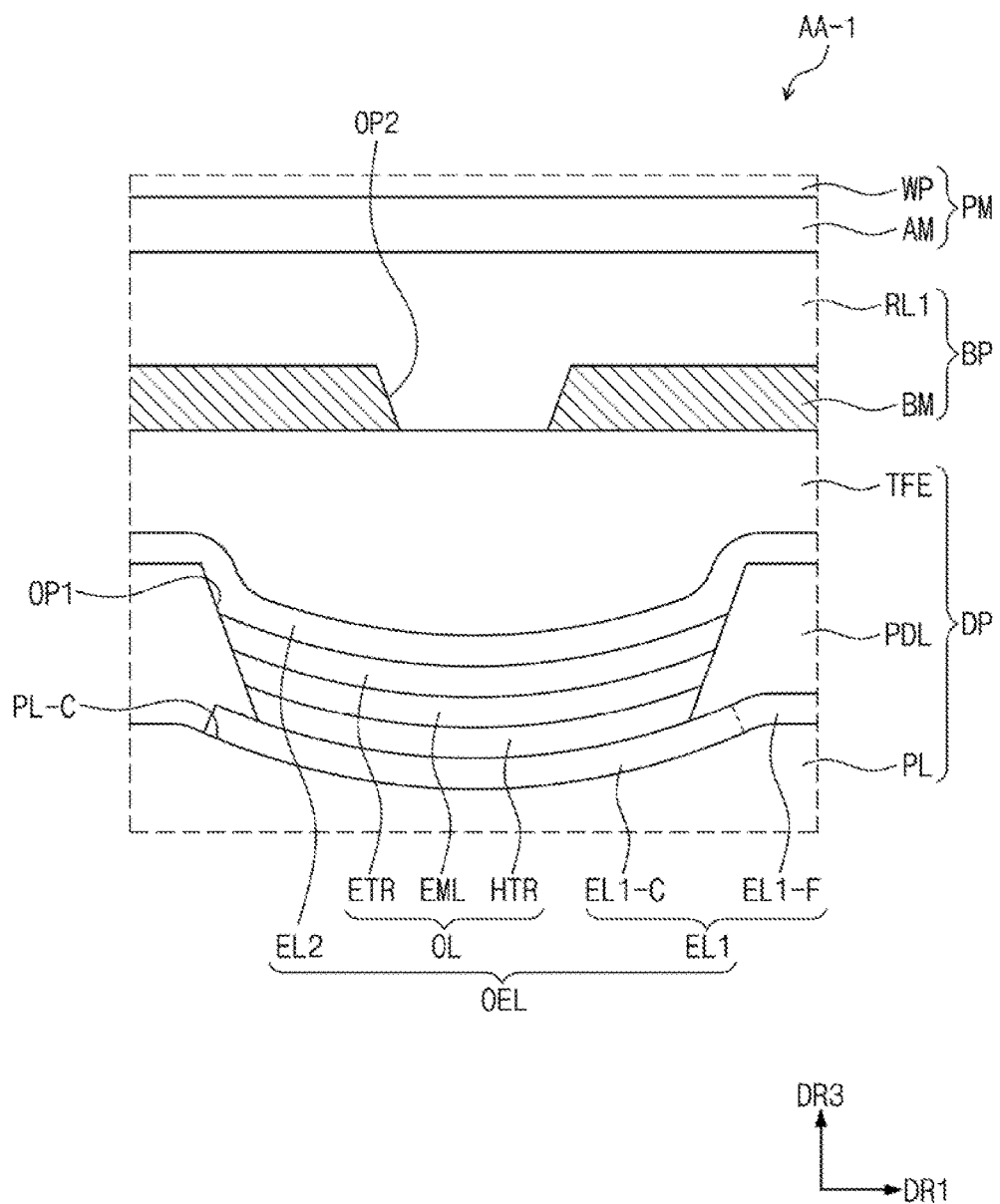
FIGS. 6A and 6B are cross-sectional views showing an organic electroluminescence display apparatus according to an exemplary embodiment of the present disclosure.
Figure 6B:
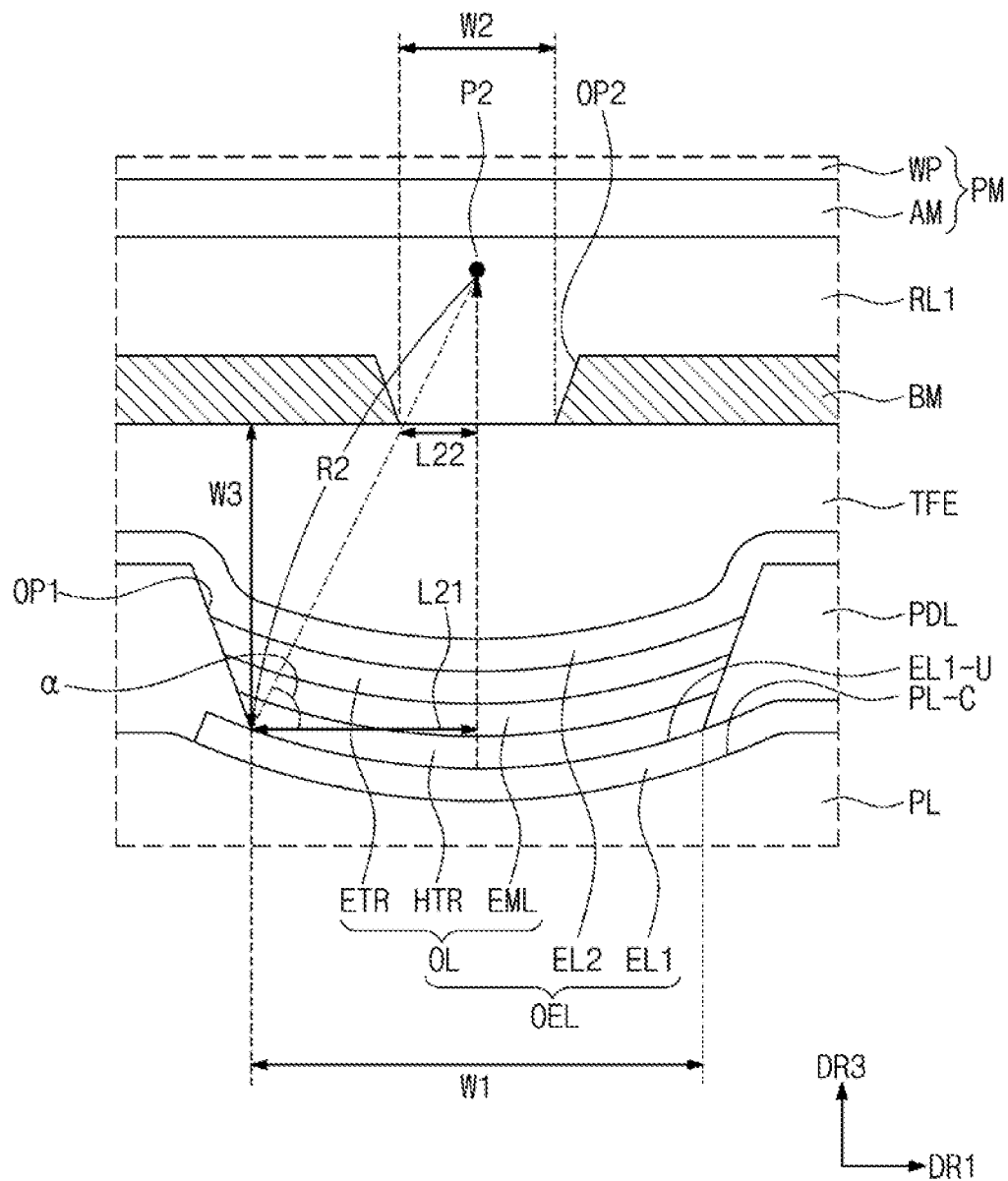

FIGS. 6A and 6B are cross-sectional views showing an organic electroluminescence display apparatus according to an exemplary embodiment of the present disclosure. FIG. 6A shows a modified embodiment with respect to the area AA of FIG. 4. FIG. 6B is a cross-sectional view showing a radius of curvature R2 of a concave upper surface EL1-U of a first electrode of the organic electroluminescence display apparatus shown in FIG. 6A.

FIG. 6A is a cross-sectional view showing the organic electroluminescence display apparatus in an area AA-1 corresponding to the area AA of FIG. 4. The organic electroluminescence display apparatus shown in FIG. 6A may further include a first optical layer RL1 disposed on a light blocking layer BM.

The organic electroluminescence display apparatus shown in FIG. 6A may include a display panel DP and a light blocking member BP disposed on the display panel DP and including the light blocking layer BM and the first optical layer RL1.

The display panel DP may include an organic electroluminescence device OEL, a pixel definition layer PDL through which a first opening OP1 is defined, and an encapsulation layer TFE disposed on the organic electroluminescence device OEL.

The first optical layer RL1 may fill a second opening OP2 of the light blocking layer BM. The first optical layer RL1 may be disposed to cover the light blocking layer BM after filling the second opening OP2. A lower surface of the first optical layer RL1 filled in the second opening OP2 may make contact with an upper surface of the encapsulation layer TFE, but it should not be limited thereto or thereby. That is, an organic layer or an inorganic layer may further be disposed between the first optical layer RL1 and the encapsulation layer TFE. However, a color filter layer is not disposed in the second opening OP2.

The first optical layer RL1 has a refractive index equal to or greater than a refractive index of the encapsulation layer TFE. In a case that the encapsulation layer TFE includes plural layers, the refractive index of the first optical layer RL1 may be equal to or greater than a refractive index of a layer most adjacent to the first optical layer RL1 among the plural layers included in the encapsulation layer TFE. For instance, the refractive index of the first optical layer RL1 may be equal to or greater than a refractive index of a layer disposed at an uppermost position among the plural layers included in the encapsulation layer TFE.

The refractive index of the first optical layer RL1 may be equal to or greater than about 1.4. In detail, the refractive index of the first optical layer RL1 may be equal to or greater than about 1.5 and equal to or smaller than about 1.7. The refractive index of the first optical layer RL1 may be controlled by forming the first optical layer RL1 to include an inorganic material, but the exemplary embodiment should not be limited thereto or thereby.

In the exemplary embodiment shown in FIG. 6A, the light blocking layer BM and the first optical layer RL1 are disposed on the display panel DP as the light blocking member to block the external light and to allow the light emitted from the organic electroluminescence device OEL to be emitted to the outside after being condensed.

Referring to FIG. 6B, a first electrode EL1 of the organic electroluminescence device OEL may include a concave upper surface EL1-U having a radius of curvature R2. The radius of curvature R2 of the concave upper surface EL1-U of the first electrode EL1 may be derived from Equation 1 described with reference to FIG. 5A.

That is, the radius of curvature R2 of the concave upper surface EL1-U of the first electrode EL1 shown in FIG. 6B may satisfy the following Equation 1-4. In FIG. 6B, P2 denotes a virtual center point corresponding to a center of the radius of curvature R2.

$$R2 \le \frac{W1}{2\cos\left[\tan^{-1}\left(\frac{W2}{W1-W3}\right)\right]} \quad \text{Equation 1-4}$$

In Equation 1-4, R2 denotes the radius of curvature R2 of the concave upper surface EL1-U of the first electrode EL1 of the organic electroluminescence display apparatus shown in FIG. 6B, W1 denotes the width of the first opening OP1, W2 denotes the width of the second opening OP2, and W3 denotes a shortest distance between the light blocking layer BM and the first electrode EL1 exposed through the first opening OP1.

The organic electroluminescence display apparatus shown in FIGS. 6A and 6B may further include a protective member PM. The protective member PM includes a base adhesive layer AM and a base layer WP and is disposed on the light blocking member BP.

Figure 7A:
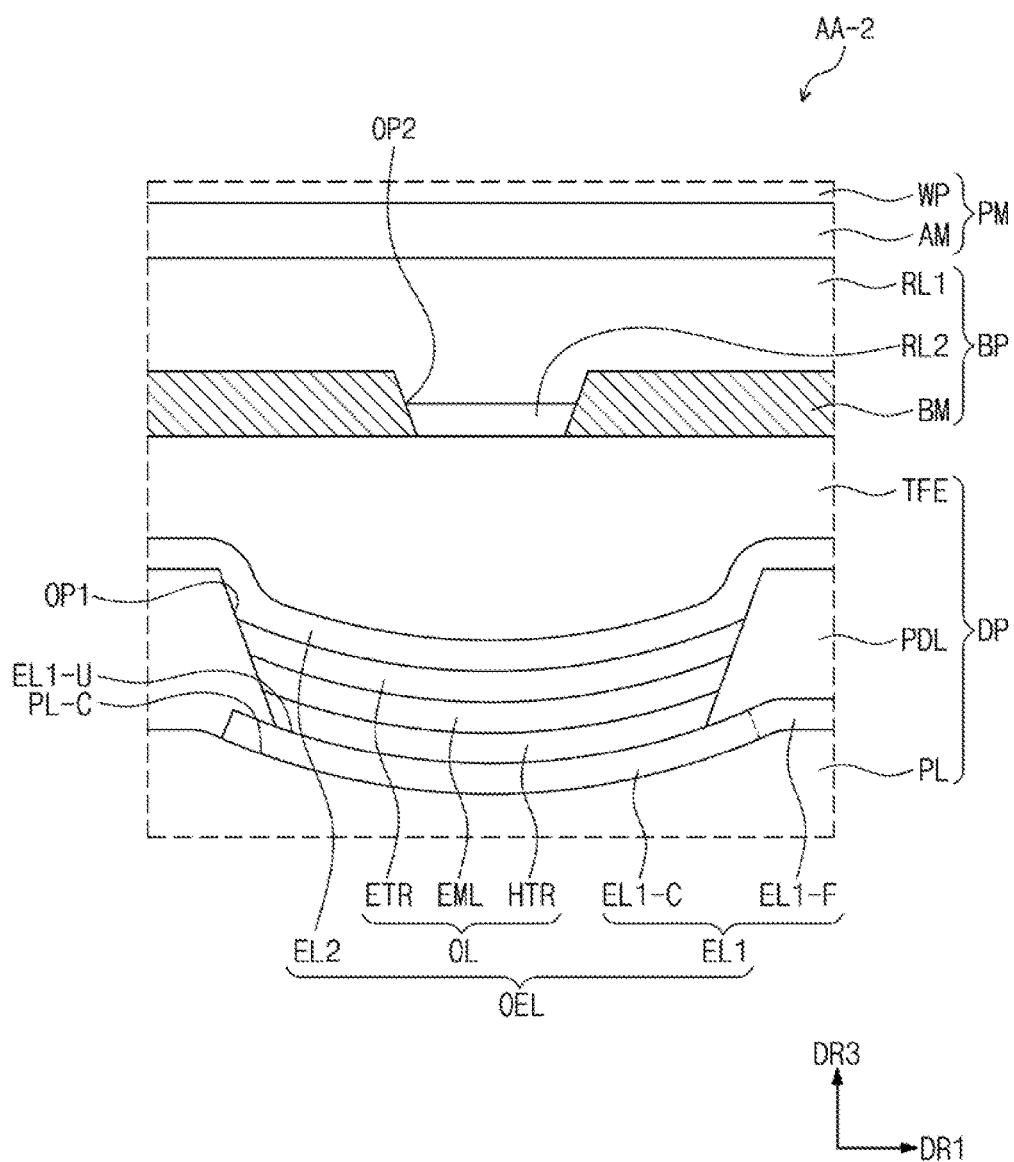
FIGS. 7A and 7B are cross-sectional views showing an organic electroluminescence display apparatus according to an exemplary embodiment of the present disclosure.
Figure 7B:
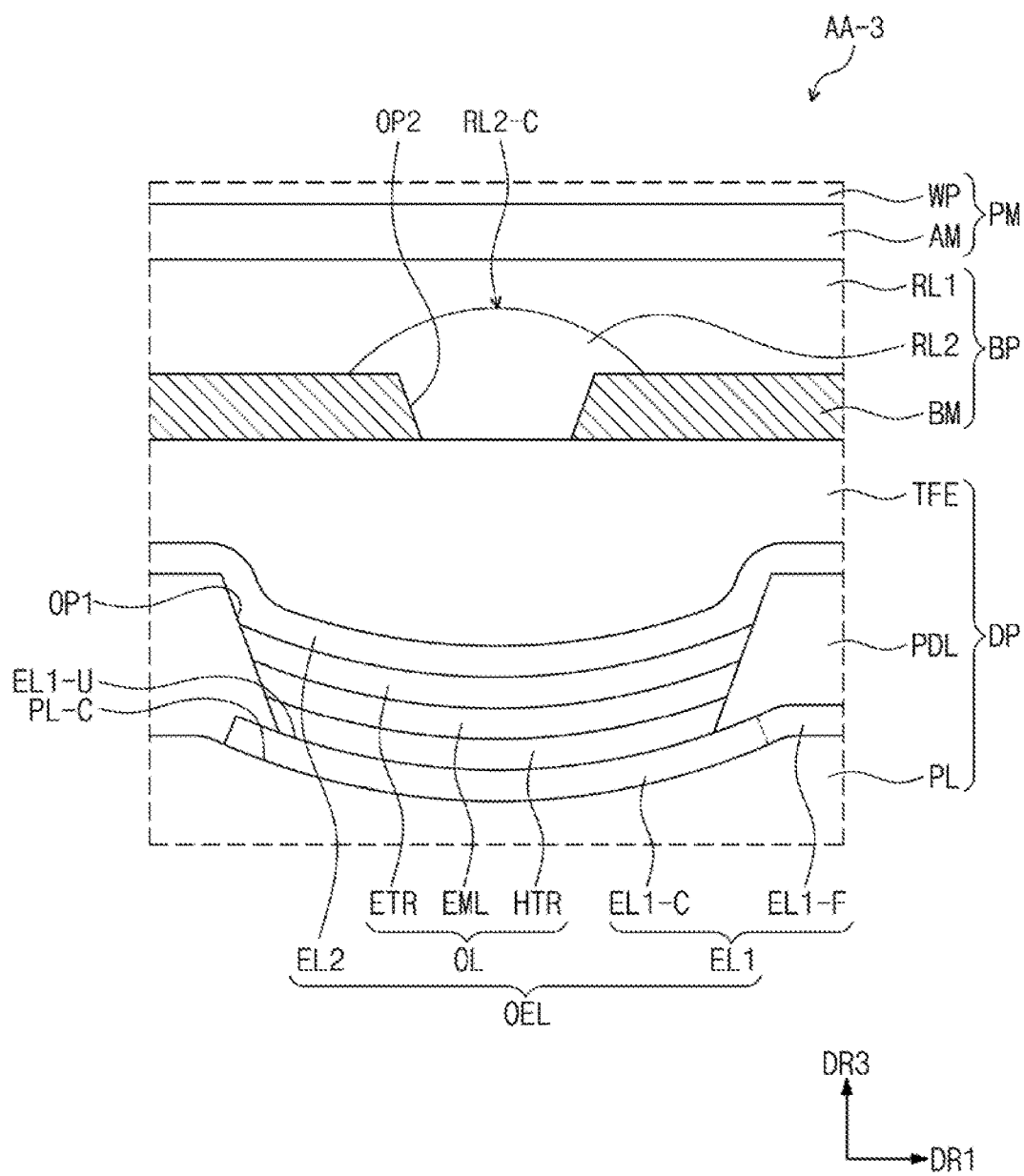

FIGS. 7A and 7B are cross-sectional views showing an organic electroluminescence display apparatus in areas AA-2 and AA-3 each corresponding to the area AA of FIG. 4 according to an exemplary embodiment of the present disclosure. The organic electroluminescence display apparatus shown in FIGS. 7A and 7B may further include a first optical layer RL1 and a second optical layer RL2.

The organic electroluminescence display apparatus shown in FIGS. 7A and 7B may include a light blocking member BP including a light blocking layer BM, the first optical layer RL1, and the second optical layer RL2. The light blocking member BP is disposed on a display panel DP, and a protective member PM is further disposed on the light blocking member BP.

The light blocking member BP may include the light blocking layer BM through which a second opening OP2 is defined, the second optical layer RL2 disposed in the second opening OP2, and the first optical layer RL1 disposed on the second optical layer RL2. In the exemplary embodiment shown in FIG. 7A, the second optical layer RL2 is disposed in the second opening OP2 to fill a portion of the second opening OP2, but it should not be limited thereto or thereby. That is, the second optical layer RL2 may fully fill the second opening OP2. In addition, the second optical layer RL2 may be disposed on the light blocking layer BM to overlap at least a portion of the light blocking layer BM after filling the second opening OP2.

Referring to FIG. 7B, the second optical layer RL2 may include a curved surface portion convex toward the first optical layer RL1. The second optical layer RL2 may be a lens part having a convex curved surface. The second optical layer RL2 may have the convex curved surface portion in an area overlapping with the second opening OP2.

In the exemplary embodiment of FIGS. 7A and 7B, the first optical layer RL1 may be disposed on the second optical layer RL2. In addition, the first optical layer RL1 may be disposed on the light blocking layer BM to cover the second optical layer RL2. The second optical layer RL2 may be an organic layer formed of an organic material. The second optical layer RL2 may have a refractive index equal to or smaller than a refractive index of the first optical layer RL1. The refractive index of the second optical layer RL2 may be smaller than the refractive index of the first optical layer RL1. As an example, the refractive index of the second optical layer RL2 may be equal to or greater than about 1.4 and equal to or smaller than about 1.5. The refractive index of the first optical layer RL1 may be equal to or greater than about 1.5 and equal to or smaller than about 1.7.

In addition, the refractive index of the second optical layer RL2 may be the same as a refractive index of an encapsulation layer TFE. In the present disclosure, the term 'same refractive index' means 'substantially same refractive index'. Accordingly, the expression that the refractive index of the second optical layer RL2 is the same as the refractive index of the encapsulation layer TFE means that there is no difference in refractive index between the second optical layer RL2 and the encapsulation layer TFE such that a light is not refracted at an interface between the second optical layer RL2 and the encapsulation layer TFE and an optical path of the light is not changed.

In a case that the encapsulation layer TFE includes plural layers, the refractive index of the second optical layer RL2 may be equal to a refractive index of a layer most adjacent to the second optical layer RL2 among the plural layers included in the encapsulation layer TFE. For instance, the refractive index of the second optical layer RL2 may be equal to a refractive index of a layer disposed at an uppermost position among the plural layers included in the encapsulation layer TFE. In detail, the refractive index of the second optical layer RL2 may be equal to a refractive index of an outermost layer of the encapsulation layer TFE, which makes contact with the second optical layer RL2.

In the exemplary embodiment, the light blocking member BP includes the light blocking layer BM through which the second opening OP2 is defined, the second optical layer RL2 disposed in the second opening OP2, and the first optical layer RL1 disposed on the second optical layer RL2. The second optical layer RL2 has the same refractive index as the encapsulation layer TFE, and the first optical layer RL1 has the refractive index greater than the refractive index of the second optical layer RL2. In this case, the light emitted from the organic electroluminescence device OEL reaches the second optical layer RL2 after passing through the encapsulation layer TFE and is refracted by the first optical layer RL1 to be emitted to the outside of the organic electroluminescence display apparatus. In this case, since the second optical layer RL2 has the same refractive index as the encapsulation layer TFE, the optical path of the light may extend. In addition, the first optical layer RL1 has the refractive index greater than the refractive index of the second optical layer RL2, and thus the light passing through the second optical layer RL2 is condensed by the first optical layer RL1 to be emitted.

In the organic electroluminescence display apparatus including the light blocking member BP that includes the first and second optical layers RL1 and RL2 as shown in FIGS. 7A and 7B, the curved electrode portion EL1-C of the first electrode EL1 may satisfy the following Equation 2.

$$R_{O2} \leq \frac{W1}{2\cos\left[\tan^{-1}\left(\frac{W3}{W1}\right)\right]} \qquad \text{Equation 2}$$

In Equation 2, $R_{O2}$ denotes a radius of curvature of the concave upper surface EL1-U of the first electrode EL1, W1 denotes the first width of the first opening OP1, and W3 denotes the shortest distance between the light blocking layer BM and the first electrode EL1 exposed through the first opening OP1.

Figure 8:
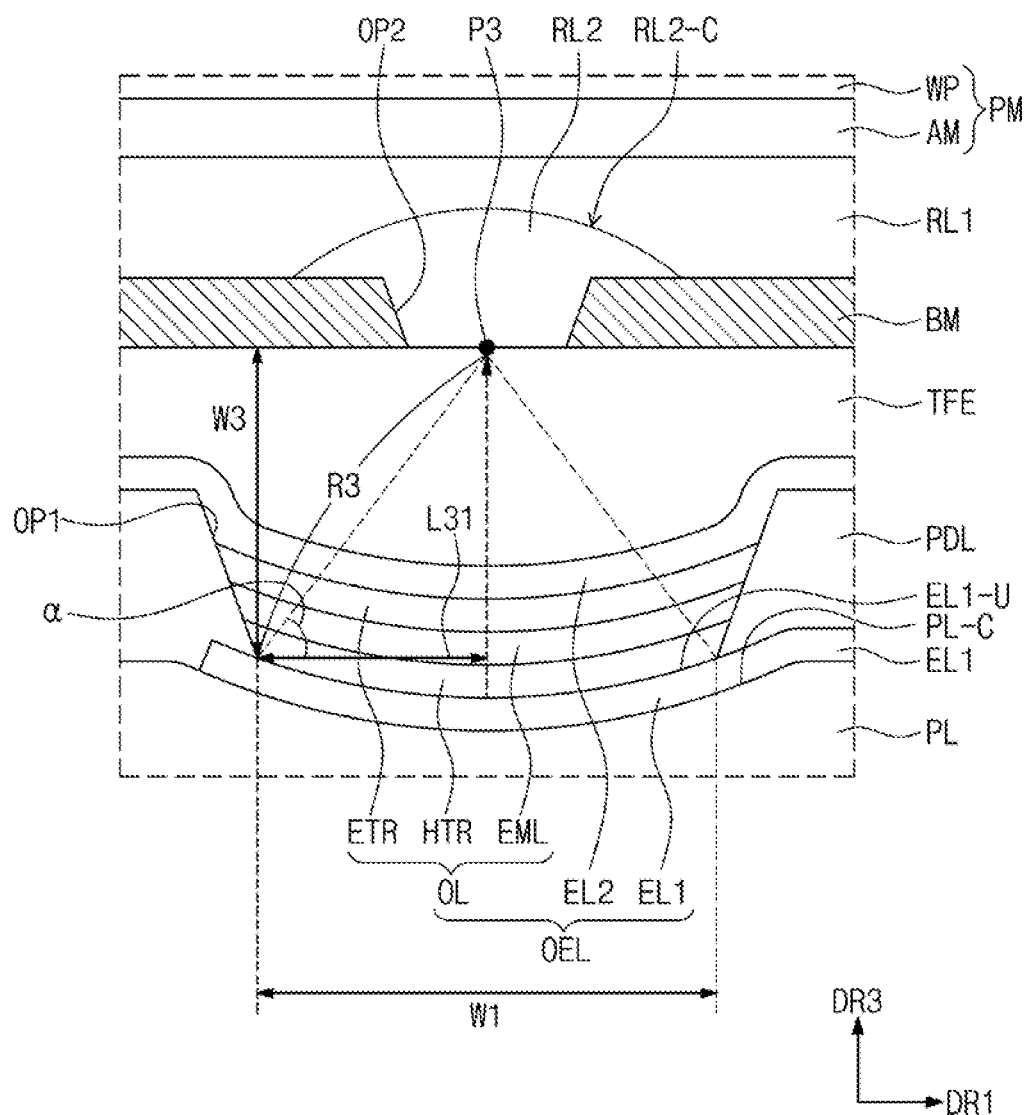
FIG. 8 is a cross-sectional view showing an organic electroluminescence display apparatus according to an exemplary embodiment of the present disclosure.

FIG. 8 is a cross-sectional view showing a radius of curvature R3 of the concave upper surface EL1-U of the first electrode EL1 in the organic electroluminescence display apparatus shown in FIG. 7B. That is, the radius of curvature R3 of the concave upper surface EL1-U of the first electrode EL1 may satisfy the following Equation 2-1 in the exemplary embodiment shown in FIG. 8. In FIG. 8, P3 denotes a virtual point indicating a center of the radius of curvature R3.

$$R3 \leq \frac{W1}{2\cos\left[\tan^{-1}\left(\frac{W3}{W1}\right)\right]} \qquad \text{Equation 2-1}$$

In FIG. 8, L31 denotes a distance between one end of the first opening OP1 defined by the pixel definition layer PDL and a center of the first opening OP1 and corresponds to a half of the width W1 of the first opening OP1. The radius of curvature R3 represented by Equation 2-1 may be applied to the concave upper surface EL1-U of the first electrode EL1 of the organic electroluminescence display apparatus shown in FIG. 7A according to an exemplary embodiment of the present disclosure.

Meanwhile, a convex curved surface portion RL2-C of the second optical layer RL2 in the organic electroluminescence display apparatus shown in FIGS. 7B and 8 according to an exemplary embodiment of the present disclosure may have the same radius of curvature as that of the concave upper surface EL1-U of the first electrode EL1, but it should not be limited thereto or thereby. The convex curved surface portion RL2-C of the second optical layer RL2 may have a different radius of curvature from that of the concave upper surface EL1-U of the first electrode EL1.

In the organic electroluminescence display apparatus shown in FIG. 7B according to an exemplary embodiment of the present disclosure, the second optical layer RL2 includes the convex curved surface portion RL2-C such that the second optical layer RL2 serves as the lens, and thus the light emitted from the organic electroluminescence device OEL may be uniformly provided to the first optical layer RL1. According to the organic electroluminescence display apparatus, which includes the second optical layer RL2 having the lens shape and the first optical layer RL1 disposed surrounding the second optical layer RL2, shown in FIG. 7B according to an exemplary embodiment of the present disclosure, a light extraction efficiency of the light generated by the organic electroluminescence device OEL may be improved.

Figure 9:
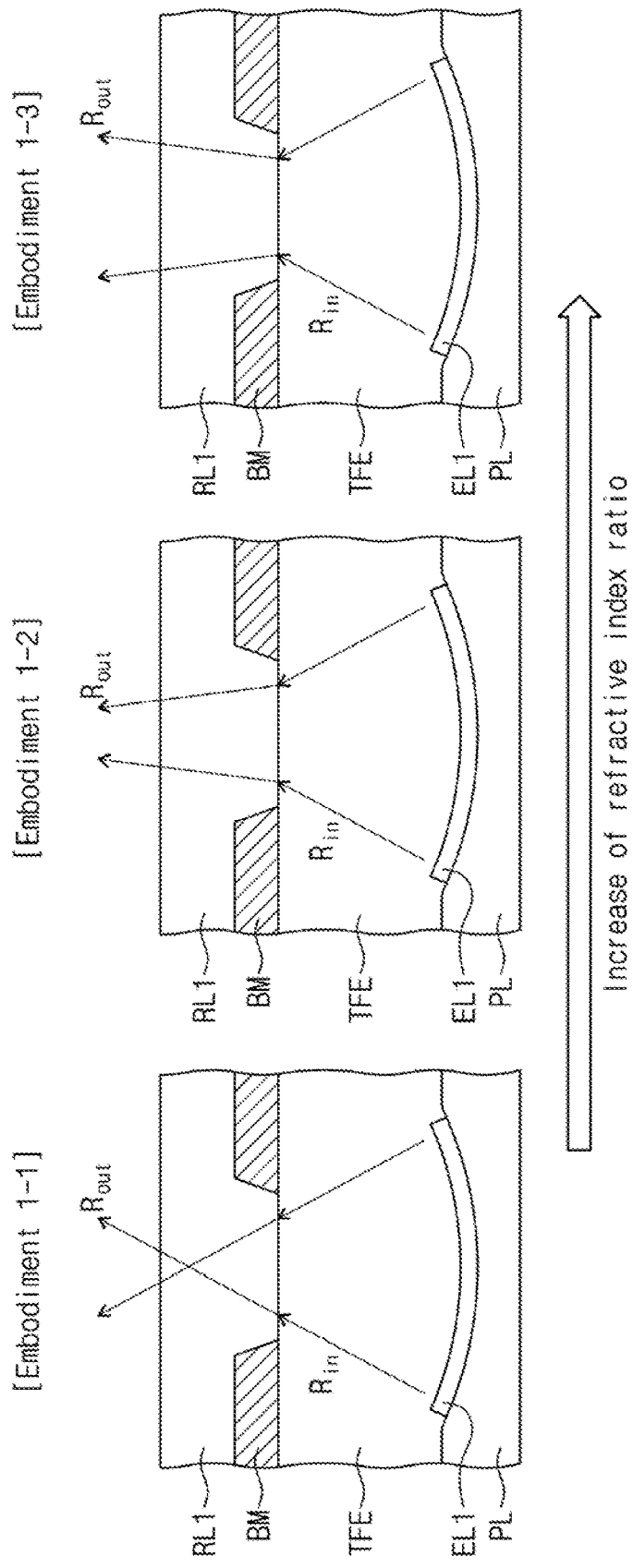
FIGS. 9 and 10 are views showing an optical path of an organic electroluminescence display apparatus according to an exemplary embodiment of the present disclosure.
Figure 10:
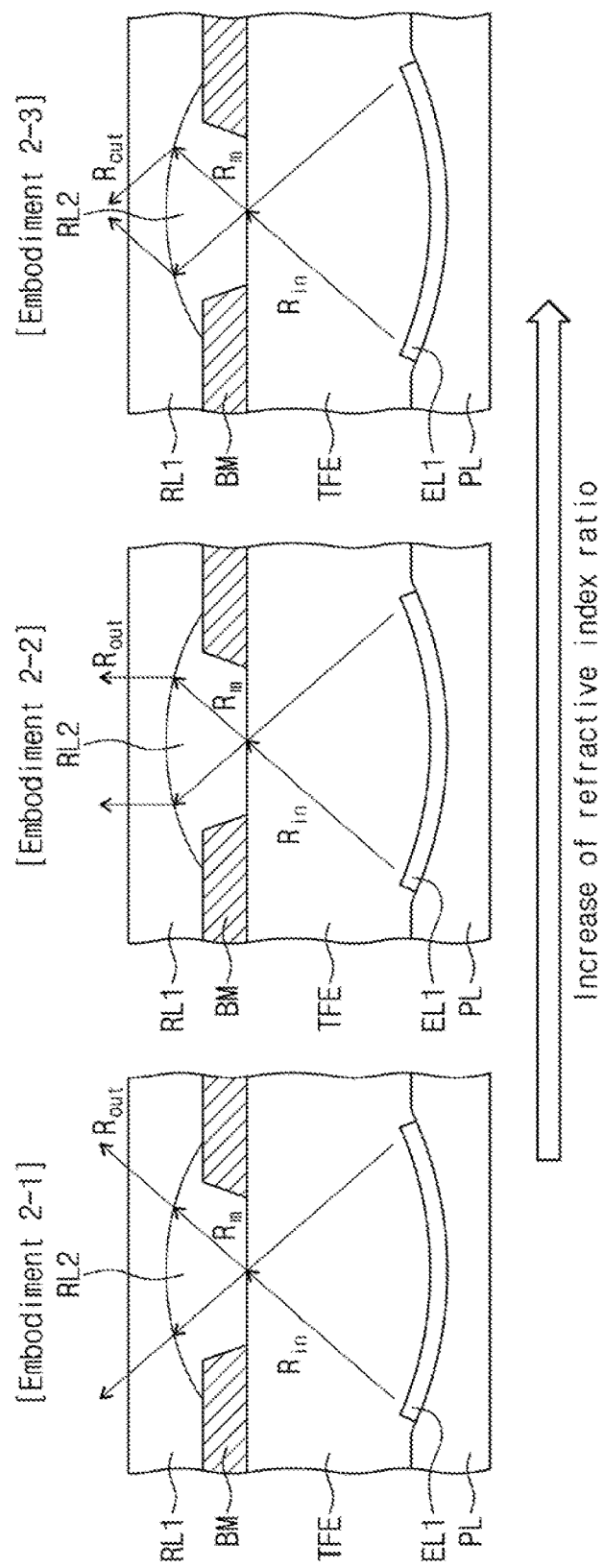

FIGS. 9 and 10 are views showing a light extraction efficiency according to a ratio in refractive index between the encapsulation layer TFE and the first optical layer RL1. FIG. 9 shows the light extraction efficiency with respect to the organic electroluminescence display apparatus shown in FIG. 6A, and FIG. 10 show the light extraction efficiency with respect to the organic electroluminescence display apparatus shown in FIG. 7B. For the convenience of explanation, FIGS. 9 and 10 show some elements of the organic electroluminescence display apparatus, and the organic layer OL and the second electrode EL2 of the organic electroluminescence device and the pixel definition layer PDL are omitted.

FIG. 9 sequentially shows embodiments 1-1, 1-2, and 1-3 in a direction in which the ratio of the refractive index of the first optical layer RL1 to the encapsulation layer TFE increases. The embodiments 1-1 to 1-3 include the first electrode EL1 having the concave upper surface, and thus the light emitted from the organic electroluminescence device OEL (refer to FIG. 6A) may be condensed to the second opening OP2 (refer to FIG. 6A) defined through the light blocking layer BM and transmitted to the first optical layer RL1. In this case, an incident light $R_{in}$ incident to the first optical layer RL1 may exit from the first optical layer RL1 as an exit light $R_{out}$ after passing through the first optical layer RL1.

The embodiment 1-1 shows a case where the encapsulation layer TFE and the first optical layer RL1 have the same refractive index. In the embodiment 1-1, the incident light $R_{in}$ incident to the first optical layer RL1 may exit from the first optical layer RL1 as the exit light $R_{out}$ after passing through the first optical layer RL1 without being refracted at an interface between the encapsulation layer TFE and the first optical layer RL1.

The embodiments 1-2 and 1-3 show cases where the refractive index of the first optical layer RL1 is greater than the refractive index of the encapsulation layer TFE. The embodiment 1-3 shows the optical path of the light in the case that the ratio of the refractive index of the first optical layer RL1 to the encapsulation layer TFE in the embodiment 1-3 is greater than that in the embodiment 1-2.

In the embodiments 1-2 and 1-3, the incident light $R_{in}$ is incident to the first optical layer RL1 after being refracted at the interface between the encapsulation layer TFE and the first optical layer RL1, and the light refracted at the interface exits to the outside as the exit light $R_{out}$ after passing through the first optical layer RL1.

In the embodiment 1-2, the exit light $R_{out}$ is condensed to increase a light exit efficiency in front of the display apparatus. In the embodiment 1-3, the light refracted at the interface between the encapsulation layer TFE and the first optical layer RL1 exits as the exit light $R_{out}$ diffused to the side surface of the display apparatus due to the high refractive index of the first optical layer RL1, and thus the light may be uniformly provided in a relatively wide viewing angle.

FIG. 10 sequentially shows embodiments 2-1, 2-2, and 2-3 in a direction in which the ratio of the refractive index of the first optical layer RL1 to the encapsulation layer TFE increases. The embodiments 2-1 to 2-3 include the first electrode EL1 having the concave upper surface, and thus the light emitted from the organic electroluminescence device OEL (refer to FIG. 7B) may be condensed to the second opening OP2 (refer to FIG. 7B) defined through the light blocking layer BM and transmitted to the second optical layer RL2. In this case, an incident light $R_{in}$ incident to the second optical layer RL2 may pass through the second optical layer RL2 as an extension light $R_m$ and may exit from the first optical layer RL1 as an exit light $R_{out}$ after passing through the first optical layer RL1.

In the embodiments 2-1 to 2-3, the second optical layer RL2 having the same refractive index as the encapsulation layer TFE is disposed in the second opening OP2, and thus the incident light $R_{in}$ incident to the second optical layer RL2 may pass through the second optical layer RL2 without being refracted at an interface between the encapsulation layer TFE and the second optical layer RL2. That is, the second optical layer RL2 may increase the length of the optical paths of the light generated by the organic electroluminescence device OEL (refer to FIG. 7B) when compared with the case where the organic electroluminescence display apparatus does not include the second optical layer RL2, and thus an amount of the light exit from the first optical layer RL1 without being blocked by the light blocking layer BM may increase. The extension light $R_m$ incident to the first optical layer RL1 from the second optical layer RL2 may exit from the first optical layer RL1 as the exit light $R_{out}$ after being refracted at an interface between the second optical layer RL2 and the first optical layer RL1 and passing through the first optical layer RL1.

The embodiment 2-1 shows a case where the encapsulation layer TFE, and the first optical layer RL1 have the same refractive index. In the embodiment 2-1, the incident light $R_{in}$ incident to the second optical layer RL2 is provided to the first optical layer RL1 as the extension light $R_m$ without being refracted at the interface between the encapsulation layer TFE and the second optical layer RL2 after passing through the second optical layer RL2. In addition, the extension light $R_m$ may exit from the first optical layer RL1 as the exit light $R_{out}$ after passing through the first optical layer RL1 without being refracted at an interface between the second optical layer RL2 and the first optical layer RL1.

The embodiments 2-2 and 2-3 show cases where the refractive index of the first optical layer RL1 is greater than the refractive index of the encapsulation layer TFE. The embodiment 2-3 shows the optical path of the light in the case that the ratio of the refractive index of the first optical layer RL1 to the encapsulation layer TFE in the embodiment 2-3 is greater than that in the embodiment 1-2.

In the embodiments 2-2 and 2-3, the extension light R passing through the second optical layer RL2 is refracted at the interface between the second optical layer RL2 and the first optical layer RL1 and incident to the first optical layer RL1, and then the extension light $R_m$ incident to the first optical layer RL1 exits from the first optical layer RL1 as the exit light $R_{out}$ after passing through the first optical layer RL1.

The embodiments 2-2 and 2-3 show the cases where the exit light $R_{out}$ is condensed and the light exit efficiency in front of the organic electroluminescence display apparatus is improved.

Figure 11A:
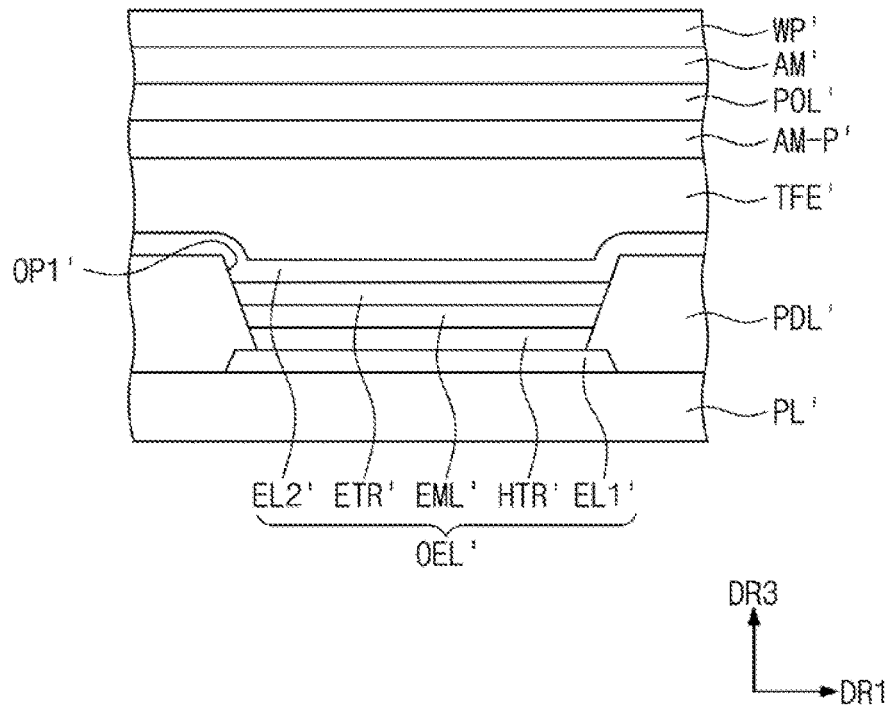
FIGS. 11A, 11B and 11C are cross-sectional views showing organic electroluminescence display apparatuses according to comparison examples.
Figure 11B:
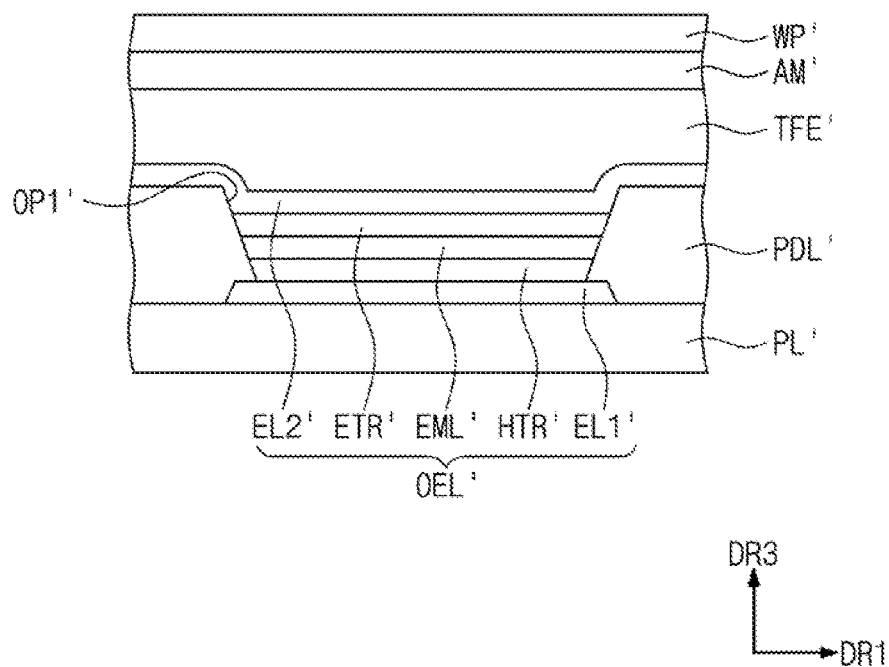
Figure 11C:
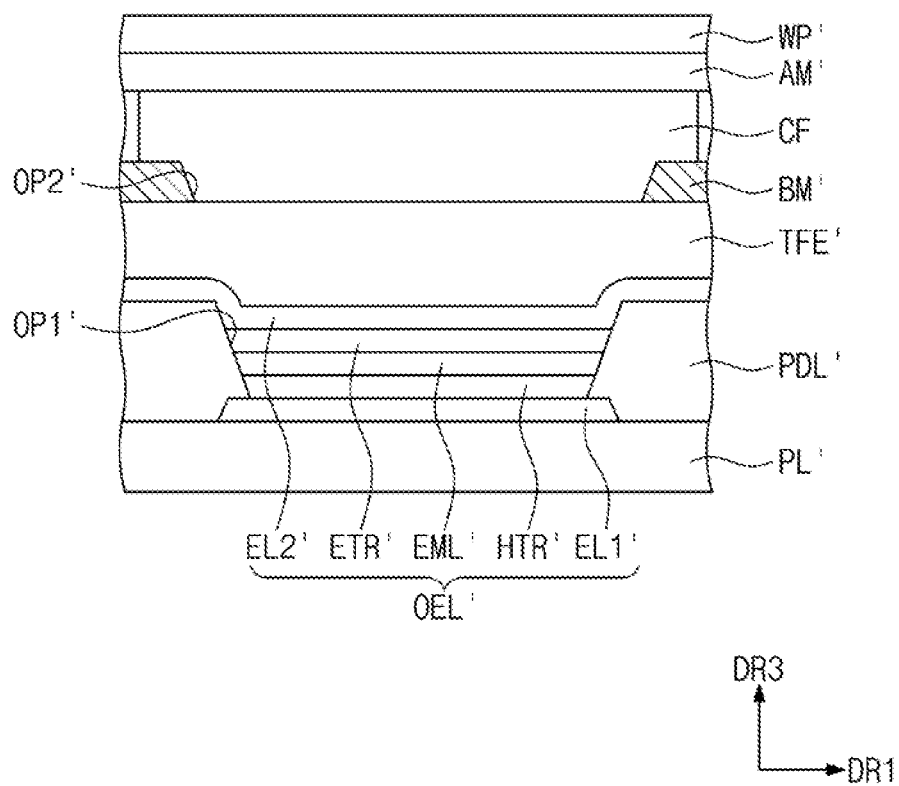
Figure 12:
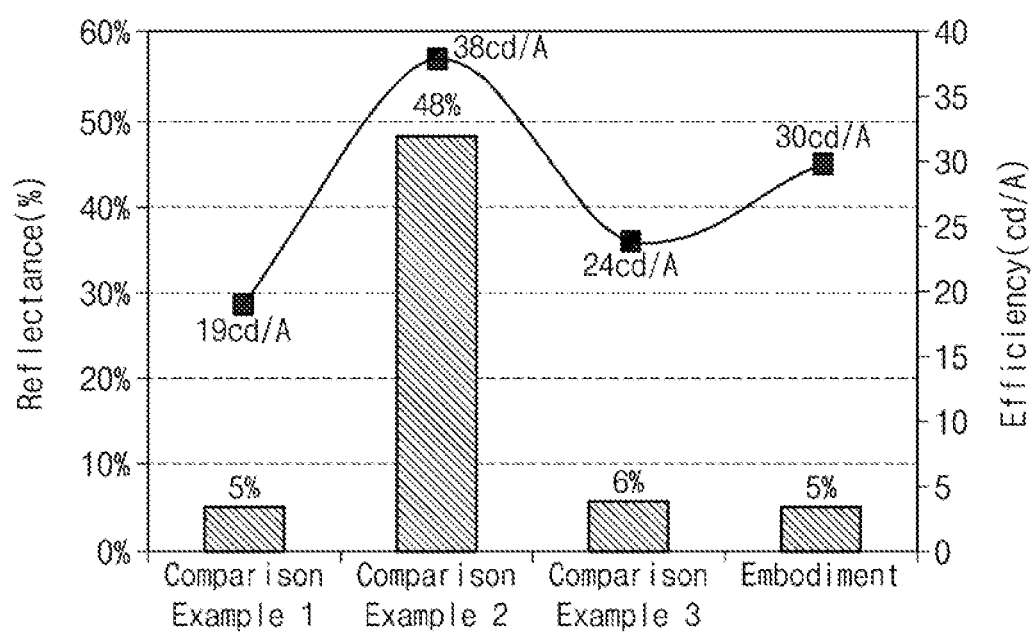
FIG. 12 is a view showing reflectance and light efficiency of an organic electroluminescence display apparatus according to an exemplary embodiment of the present disclosure and an organic electroluminescence display apparatus according to a comparison example.

FIGS. 11A to 11C are cross-sectional views showing organic electroluminescence display apparatuses according to comparison examples, and FIG. 12 is a view showing reflectance and light efficiency of an organic electroluminescence display apparatus according to an exemplary embodiment of the present disclosure and an organic electroluminescence display apparatus according to a comparison example.

The comparison examples of the organic electroluminescence display apparatuses shown in FIGS. 11A to 11C have different configurations of the light blocking member used to block the external light when compared to the organic electroluminescence display apparatus according to the exemplary embodiment of the present disclosure. In addition, the comparison examples of the organic electroluminescence display apparatuses shown in FIGS. 11A to 11C have a different shape of an upper surface of a first electrode from that of the organic electroluminescence display apparatus according to the exemplary embodiment of the present disclosure.

The organic electroluminescence display apparatus according to the comparison examples of FIGS. 11A to 11C includes an insulating layer PL' and an organic electroluminescence device OEL' disposed on the insulating layer PL'. A pixel definition layer PDL' through which a first opening OPh' is defined to expose a first electrode EL1' is disposed on the insulating layer PL'. In the comparison examples, the first electrode EL1' disposed on the insulating layer PL' has a flat upper surface. A base layer WP' may be disposed on the organic electroluminescence device OEL', and a base adhesive layer AM' may be disposed under the base layer WP' to attach the base layer WP' to a display panel.

The comparison example shown in FIG. 11A shows a case where a polarizing member POL' is disposed on an encapsulation layer TFE'. The comparison example shown in FIG. 11B shows a case where a light blocking member is not disposed on the encapsulation layer TFE'. The comparison example shown in FIG. 11C shows a case where a light blocking layer BM' and a color filter layer CF are disposed on the encapsulation layer TFE' as a light blocking member.

In FIG. 12, a first comparison example indicates the organic electroluminescence display apparatus of the comparison example shown in FIG. 11A, and second and third comparison examples respectively indicate organic electroluminescence display apparatuses shown in FIGS. 11B and 11C. An embodiment example indicates the organic electroluminescence display apparatus shown in FIG. 7B.

Referring to FIG. 12, the embodiment example may have a reflectance value similar to that of the first and third comparison examples and an improved light efficiency value than that of the first and third comparison examples. In the case of the second comparison example, the light efficiency value is higher than that of the embodiment example since the light blocking member is not disposed on the display panel, but the reflectance is represented at about 48% that is higher than that of the embodiment example. Accordingly, the reflectance value of the embodiment example with respect to the external light is more improved than the second comparison example.

That is, the organic electroluminescence display apparatus according to the exemplary embodiment of the present disclosure includes the first electrode having the concave curved surface, and the light blocking layer having the opening smaller than the opening of the pixel definition layer is disposed on the display panel. Therefore, the reflectance with respect to the external light may be lowered, and the light efficiency may be improved.

Figure 13A:
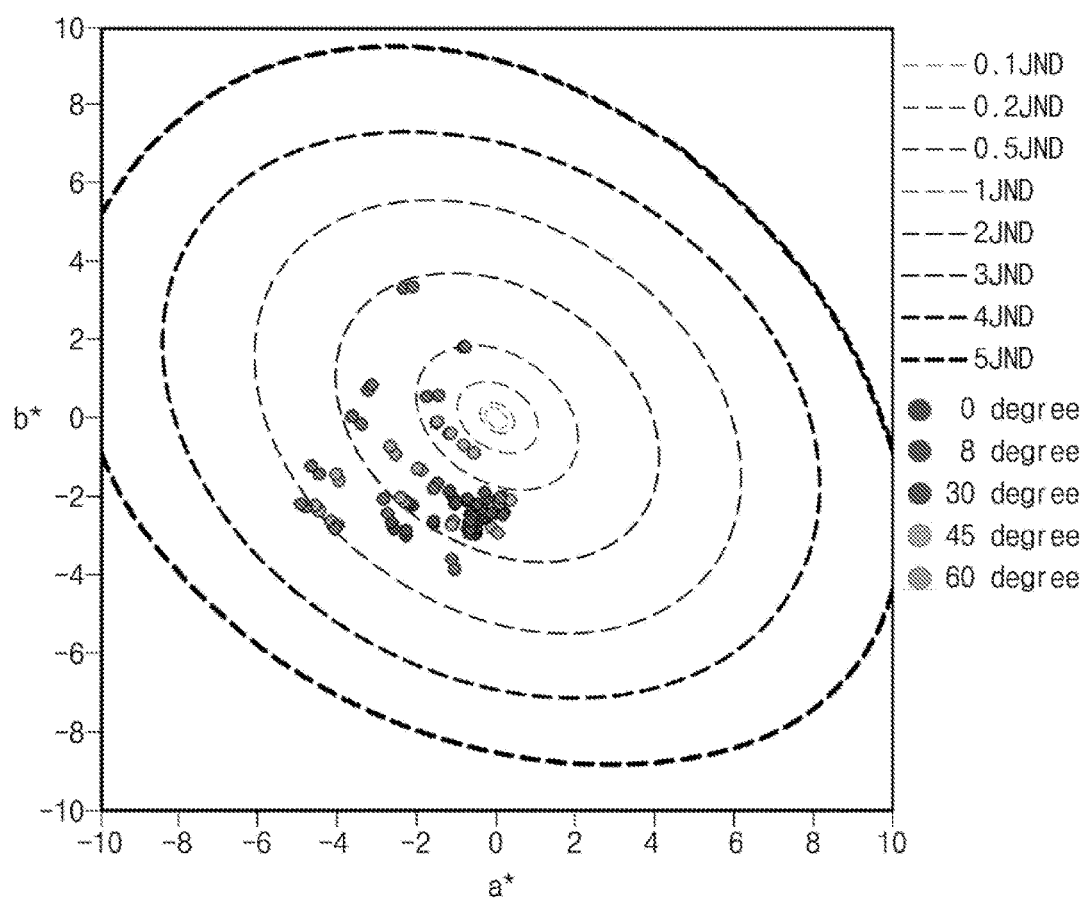
FIG. 13A is a view showing a variation of a reflective color according to a viewing angle of an organic electroluminescence display apparatus according to a comparison example.
Figure 13B:
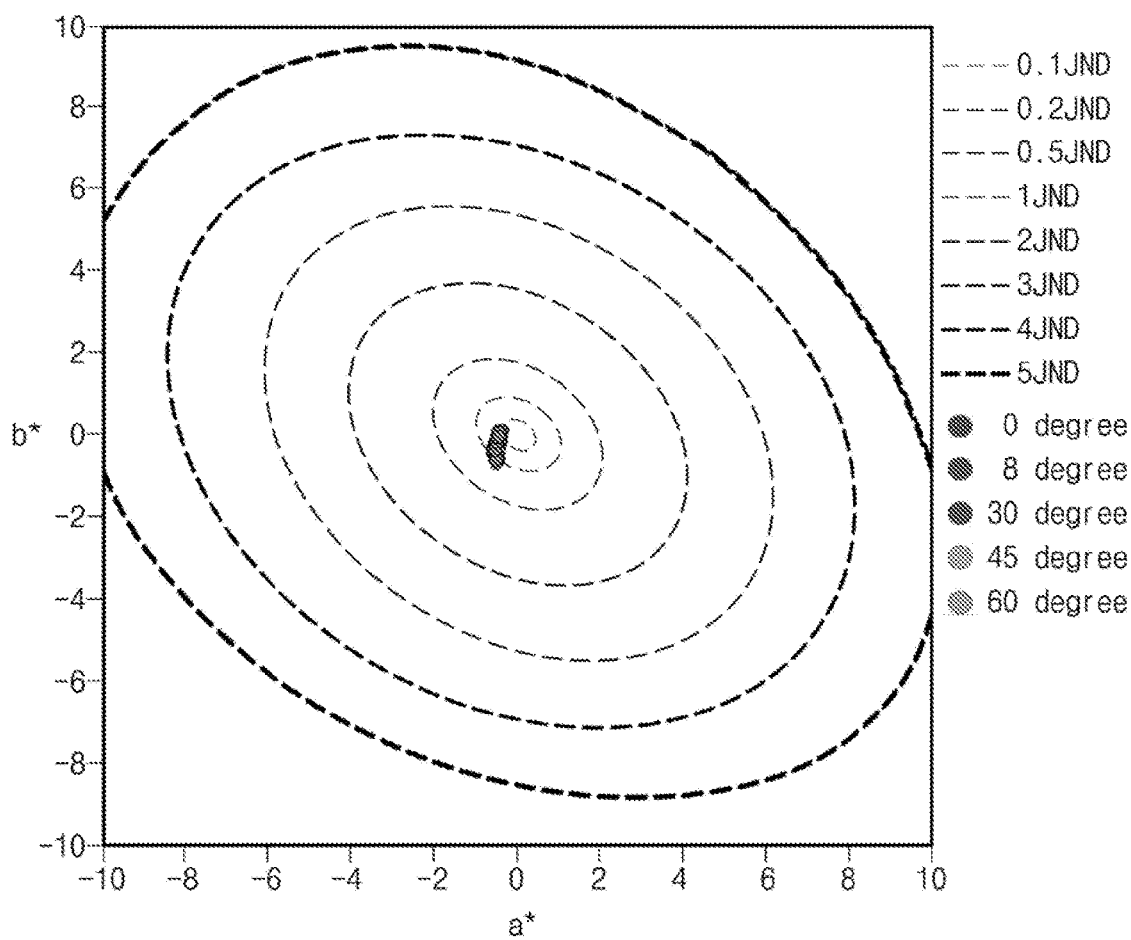
FIG. 13B is a view showing a variation of a reflective color according to a viewing angle of an organic electroluminescence display apparatus according to an exemplary embodiment of the present disclosure.
Figure 14A:
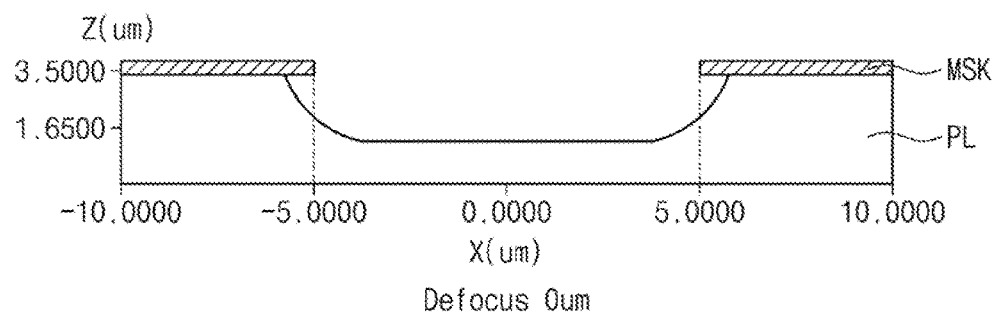
FIGS. 14A, 14B, 14C and 14D are cross-sectional views showing a method of forming a concave portion of an insulating layer.
Figure 14B:
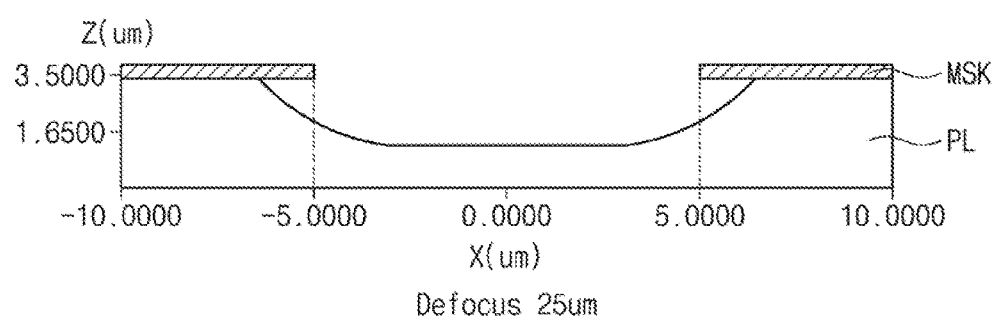
Figure 14C:
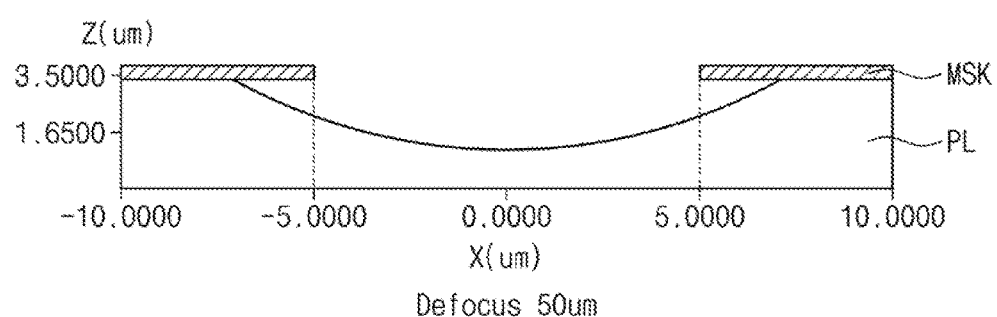
Figure 14D:
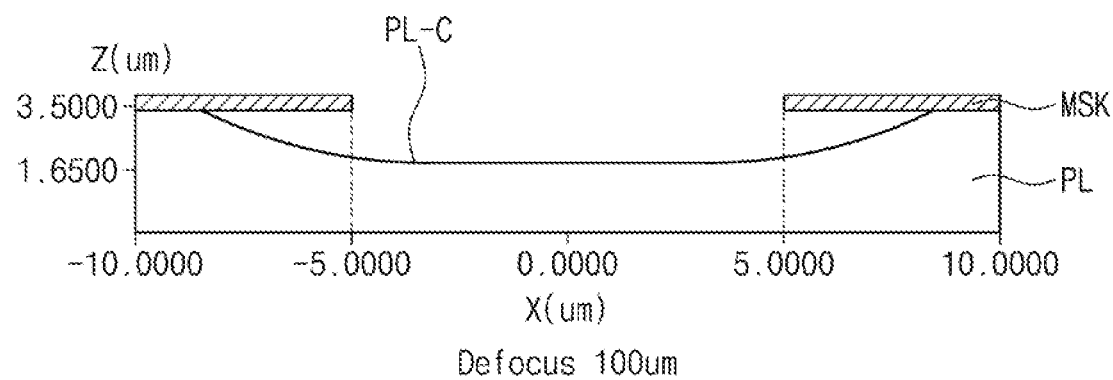

FIGS. 13A and 13B are views showing a reflective color according to a viewing angle. FIG. 13A shows a reflective color with respect to the comparison example shown in FIG. 11A, and FIG. 13B shows a reflective color with respect to the organic electroluminescence display apparatus shown in FIG. 5A. FIGS. 13A and 13B show a color coordinate (a*, b*) of a light observed at an inclination angle of about 0 degrees to about 60 degrees. In FIGS. 13A and 13B, a value represented by "JND" indicates an extent to which a color change is detected by the human eye, and a variation in color may be easily observed by the human eye as the "JND value" increases.

In FIG. 13A, color coordinate values of the light observed at each inclination angle are distributed in a wide range, and a range of JND value is wide. In FIG. 13B showing the reflective color with respect to the organic electroluminescence display apparatus according to the present disclosure, the variation of the color coordinate with respect to the viewing angle is not wide, and the color coordinate with respect to all inclination angles are represented in a range of JND value equal to or smaller than about 0.5.

That is, the organic electroluminescence display apparatus according to the exemplary embodiment of the present disclosure includes the light blocking layer having the opening with the width smaller than that of the pixel definition layer to reduce the reflectance with respect to the external light. Accordingly, the variation in color of the reflective light according to the viewing angle may be reduced to improve the reflective color, and thus a display quality may be improved.

FIGS. 14A to 14D are cross-sectional views showing a method of forming the concave portion PL-C of the insulating layer PL in the organic electroluminescence display apparatus according to an exemplary embodiment of the present disclosure. The concave portion PL-C may be formed by processing the insulating layer PL using a photolithography process. FIGS. 14A to 14D show shapes of the concave portion PL-C depending on a defocusing distance of an exposure light source.

A mask MSK may be disposed on the insulating layer PL to form the concave portion PL-C of the insulating layer PL. The mask MSK has an opening smaller than a maximum width of the concave portion PL-C. Here, the defocus distance indicates an extent to which the exposure light source is away from the plane or surface of best focus. The curvature of the concave portion PL-C may be controlled by adjusting the defocus distance of the exposure light source. Referring to FIGS. 14A to 14D, as the defocus distance increases, the curvature of the concave portion PL-C increases.

Figure 15A:
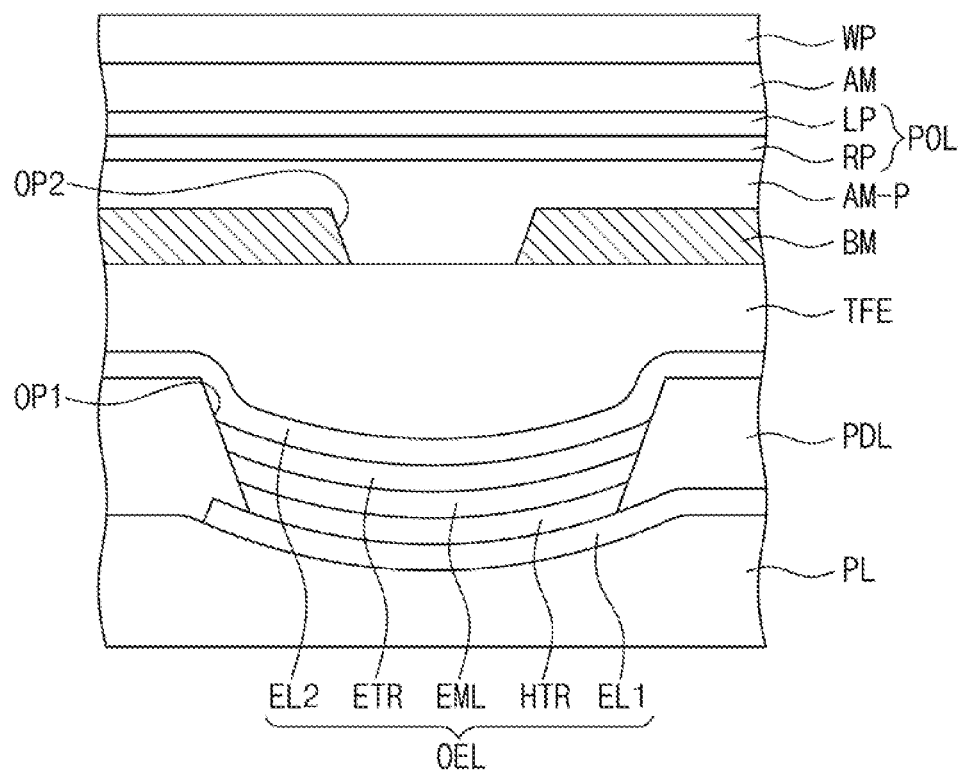
FIGS. 15A, 15B and 15C are cross-sectional views showing an organic electroluminescence display apparatus according to an exemplary embodiment of the present disclosure.
Figure 15B:
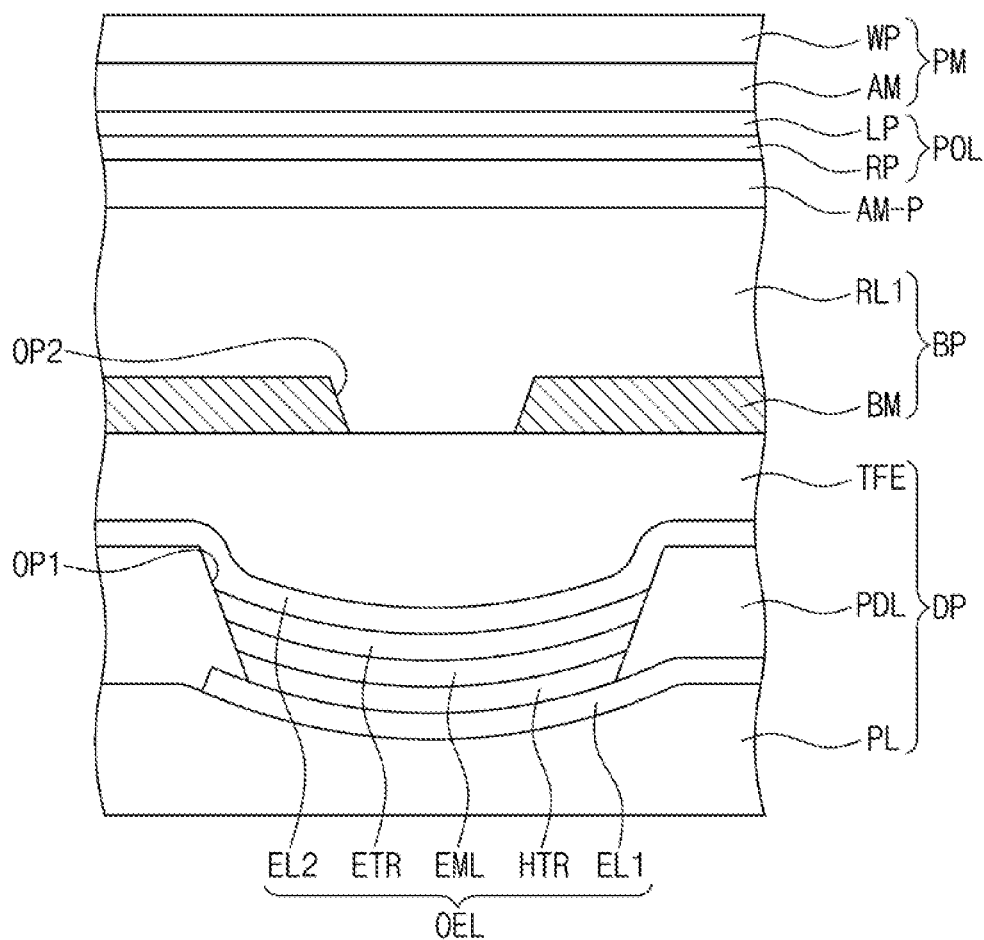
Figure 15C:
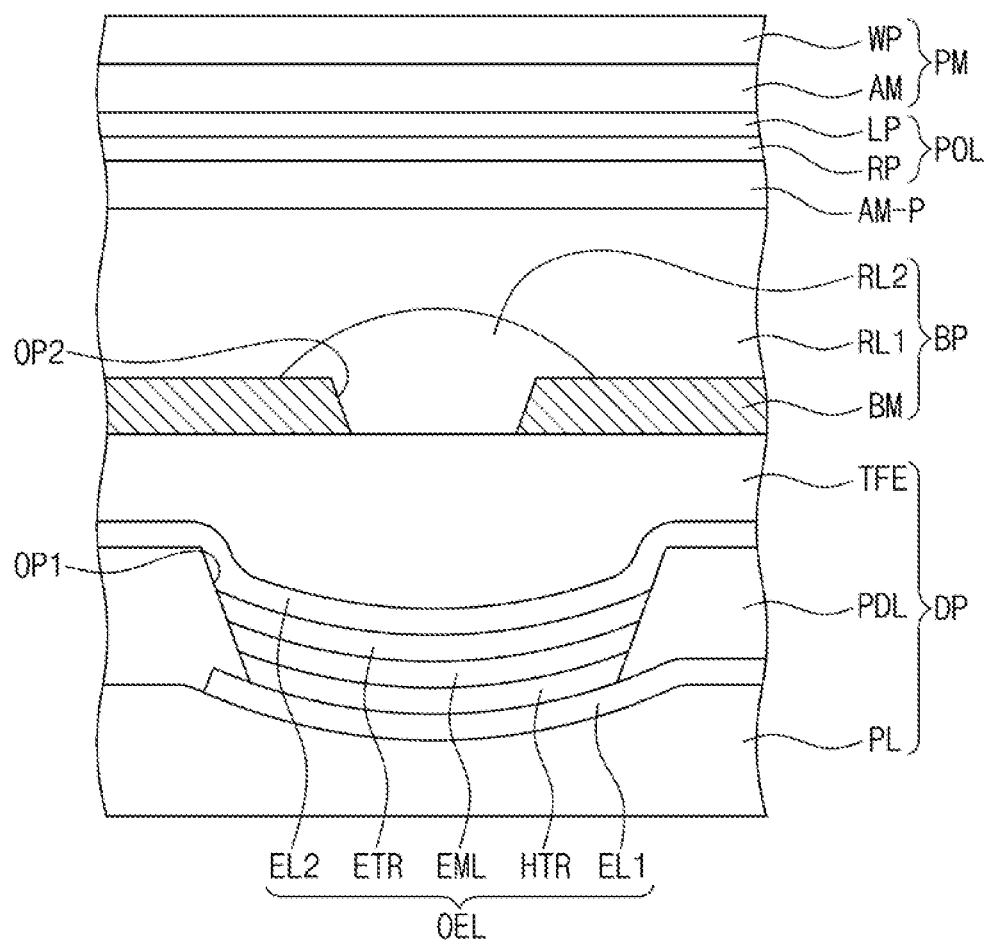

FIGS. 15A to 15C are cross-sectional views showing an organic electroluminescence display apparatus according to an exemplary embodiment of the present disclosure. The organic electroluminescence display apparatus shown in FIGS. 15A to 15C may further include a polarizing layer POL on a light blocking layer BM.

The organic electroluminescence display apparatus shown in FIG. 15A have the same structure and function as those of the organic electroluminescence display apparatus shown in FIG. 5A except for the polarizing layer POL on the light blocking layer BM. The organic electroluminescence display apparatuses shown in FIGS. 15B and 15C have the same structure and function as those of the organic electroluminescence display apparatuses shown in FIGS. 6A and 7B, respectively, except for the polarizing layer POL on the light blocking member BP.

In the organic electroluminescence display apparatuses shown in FIGS. 15A to 15C according to exemplary embodiments of the present disclosure, the polarizing layer POL may include a linear polarizer and λ/4 retarder. The linear polarizer may be disposed on the λ/4 retarder. λ/2 retarder may further be disposed between the linear polarizer and the λ/4 retarder.

The linear polarizer may have a transmission axis transmitting a light vibrated in one direction. The linear polarizer may be a coating type polarizer or a polarizer formed by a deposition process. The linear polarizer may be formed by coating a material containing a dichroic dye and a liquid crystal compound.

The λ/4 retarder may be disposed between the linear polarizer and the light blocking layer BM. The λ/4 retarder may be a liquid crystal coating layer. The λ/4 retarder may be an optical layer to retard a phase of the light incident thereto by a λ/4. The λ/4 retarder may change a polarization state of the light incident to the λ/4 retarder. That is, a linearly polarized light may be changed into a circularly polarized light after passing through the λ/4 retarder. In addition, a circularly polarized light may be changed into a linearly polarized light after passing through the λ/4 retarder.

In FIGS. 15A to 15C, the polarizing layer POL including the linear polarizer LP and the λ/4 retarder RP is further disposed on the light blocking member BP, and thus a blocking rate of the light incident to the display panel DP from the outside of the display panel DP may increase.

Meanwhile, the polarizing layer POL may be, but not limited to, a film type polarizing member, and the λ/4 retarder may be, but not limited to, a film type optical member.

A polarizing adhesive layer AM-P may further be disposed between the polarizing layer POL and the light blocking member BP. The polarizing adhesive layer AM-P may be, but not limited to, a transparent optical adhesive layer. In a case that the polarizing layer is provided as a coating type, the polarizing adhesive layer AM-P may be omitted.

Figure 16:
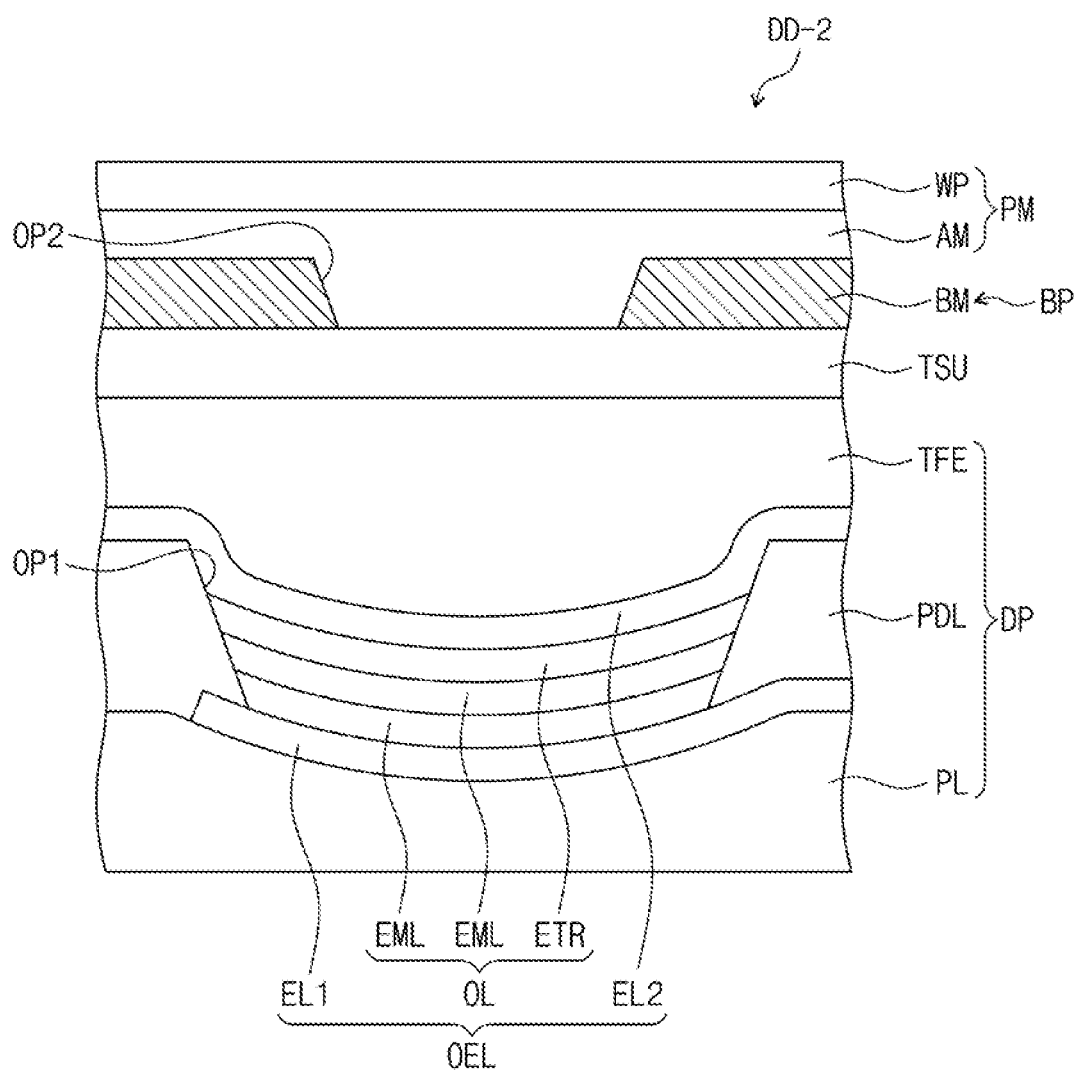
FIG. 16 is a cross-sectional view showing an organic electroluminescence display apparatus according to an exemplary embodiment of the present disclosure.

FIG. 16 is a cross-sectional view showing an organic electroluminescence display apparatus DD-2 according to an exemplary embodiment of the present disclosure. The organic electroluminescence display apparatus DD-2 may further include an input sensing unit TSU disposed on the display panel DP. The input sensing unit TSU may be disposed between the display panel DP and the light blocking member BP. The input sensing unit TSU may be disposed between the encapsulation layer TFE and the light blocking layer BM.

The input sensing unit TSU may recognize a direct touch of a user, an indirect touch of the user, a direct touch of an object, or an indirect touch of the object. The input sensing unit TSU may sense at least one of a position of the touch applied from the outside of the input sensing unit TSU and an intensity (pressure) of the touch applied from the outside of the input sensing unit TSU. The input sensing unit TSU according to the exemplary embodiment of the present disclosure may have various structures or include various materials, but it should not be particularly limited. For instance, the input sensing unit TSU of the organic electroluminescence display apparatus DD-2 may be a touch sensing unit sensing the touch.

FIG. 16 shows the organic electroluminescence display apparatus DD-2 that has the same structure as the organic electroluminescence display apparatus shown in FIG. 5A and further includes the input sensing unit TSU, but it should not be limited thereto or thereby. The organic electroluminescence display apparatuses shown in FIGS. 6A. 7A, and 7B may further include the input sensing unit TSU disposed between the encapsulation layer TFE and the light blocking member BP.

The organic electroluminescence display apparatus according to the exemplary embodiment includes the light blocking layer, which has the opening smaller than the opening of the pixel definition layer defining the light emitting area and disposed on the display panel, to effectively prevent the external light from entering the display panel. In addition, the first electrode of the organic electroluminescence device has the concave upper surface to allow the light generated by the organic electroluminescence device to be condensed in the opening of the light blocking layer, and thus the light extraction efficiency may be high even though the light blocking layer is disposed on the display panel.

In addition, the organic electroluminescence display apparatus according to the exemplary embodiment includes the optical layer disposed on the light blocking member disposed on the display panel to control the optical path of the light exiting to the outside after passing through the opening of the light blocking layer, and thus the light condensing efficiency in the front direction may increase or a diffusion degree of the light may increase such that the light is uniformly provided through a wide viewing angle range. That is, the organic electroluminescence display apparatus according to the exemplary embodiment may further include the optical layer in addition to the light blocking member having the light blocking layer to change the optical path of the light exiting to the outside, thereby improving the light efficiency or the light uniformity.

Although the exemplary embodiments of the present inventive concept have been described, it is understood that the present inventive concept should not be limited to these exemplary embodiments but various changes and modifications can be made by one ordinary skilled in the art within the spirit and scope of the present inventive concept as hereinafter claimed.

Therefore, the disclosed subject matter should not be limited to any single embodiment described herein, and the scope of the present inventive concept shall be determined according to the attached claims.

What is claimed is:

1. An organic electroluminescence display apparatus comprising:
   an insulating layer comprising a concave portion having a concave first upper surface;
   a first electrode disposed on the insulating layer and comprising a curved electrode portion having a concave second upper surface overlapped with the concave portion;
   a pixel definition layer disposed on the insulating layer and comprising a first opening defined therethrough to expose the second upper surface;
   an organic layer disposed on the first electrode;
   a second electrode disposed on the organic layer; and
   a light blocking layer disposed on the second electrode and comprising a second opening defined therethrough, the second opening having a width smaller than the first opening and being overlapped with the first opening.

2. The organic electroluminescence display apparatus of claim 1, wherein the curved electrode portion satisfies the following Equation 1 of $$R_{O1} \leq \frac{W1}{2\cos\left[\tan^{-1}\left(\frac{W2}{W1-W3}\right)\right]},$$

where $R_{O1}$ denotes a radius of curvature of the second upper surface, W1 denotes a first width of the first opening, W2 denotes a second width of the second opening, and W3 denotes a shortest distance between the light blocking layer and the first electrode exposed through the first opening.

3. The organic electroluminescence display apparatus of claim 1, wherein a minimum width of the first opening is equal to or greater than a maximum width of the second opening.

4. The organic electroluminescence display apparatus of claim 1, wherein an edge line of the second opening is disposed inside an edge line of the first opening when viewed in a plan view.

5. The organic electroluminescence display apparatus of claim 1, wherein the organic layer comprises a hole transport region, a light emitting layer, and an electron transport region, which are sequentially stacked one on another, and each of the hole transport region, the light emitting layer, and the electron transport region comprises a curved surface corresponding to the curved electrode portion.

6. The organic electroluminescence display apparatus of claim 1, further comprises a protective member disposed on the light blocking layer, wherein the protective member comprises:
a base adhesive layer filled in the second opening and disposed on the light blocking layer; and
a base layer disposed on the base adhesive layer.

7. The organic electroluminescence display apparatus of claim 1, further comprising an encapsulation layer disposed between the second electrode and the light blocking layer.

8. The organic electroluminescence display apparatus of claim 7, further comprising a first optical layer disposed on the light blocking layer, wherein the first optical layer has a first refractive index equal to or greater than a refractive index of the encapsulation layer.

9. The organic electroluminescence display apparatus of claim 8, wherein the first optical layer is filled in the second opening.

10. The organic electroluminescence display apparatus of claim 8, further comprising a second optical layer overlapped with the second opening, disposed between the encapsulation layer and the first optical layer, and having a second refractive index equal to or smaller than the first refractive index.

11. The organic electroluminescence display apparatus of claim 10, wherein the second refractive index is equal to the refractive index of the encapsulation layer.

12. The organic electroluminescence display apparatus of claim 10, wherein the curved electrode portion satisfies the following Equation 2 of $$R_{O2} \leq \frac{W1}{2\cos\left[\tan^{-1}\left(\frac{W3}{W1}\right)\right]},$$

where $R_{O2}$ denotes a radius of curvature of the second upper surface, W1 denotes a first width of the first opening, and W3 denotes a shortest distance between the light blocking layer and the first electrode exposed through the first opening.

13. The organic electroluminescence display apparatus of claim 10, wherein the second optical layer is filled in the second opening and partially overlapped with the light blocking layer.

14. The organic electroluminescence display apparatus of claim 10, wherein the second optical layer comprises a curved portion convex toward the first optical layer direction.

15. The organic electroluminescence display apparatus of claim 14, wherein the second upper surface has a radius of curvature equal to a radius of curvature of the convex curved portion.

16. The organic electroluminescence display apparatus of claim 1, further comprising a polarizing layer disposed on the light blocking layer, wherein the polarizing layer comprises a λ/4 retarder and a linear polarizer disposed on the λ/4 retarder.

17. The organic electroluminescence display apparatus of claim 1, further comprising an input sensing unit disposed between the second electrode and the light blocking layer.

18. An organic electroluminescence display apparatus comprising:
a display panel; and
a light blocking member disposed on the display panel, the display panel comprising:
a substrate;
a first electrode comprising a curved surface convex toward the substrate;
a pixel definition layer disposed on the substrate and comprising a first opening defined therethrough to expose the first electrode;
at least one organic layer disposed on the first electrode;
a second electrode disposed on the at least one organic layer; and
an encapsulation layer disposed on the second electrode, wherein the light blocking member comprises a light blocking layer having a second opening defined through the light blocking layer, and the second opening has a width smaller than the first opening and is overlapped with the first opening.

19. The organic electroluminescence display apparatus of claim 18, wherein the light blocking member further comprises an optical layer disposed on the light blocking layer and having a refractive index equal to or greater than a refractive index of the encapsulation layer.

20. The organic electroluminescence display apparatus of claim 18, wherein the light blocking member further comprises:
an optical layer disposed on the light blocking layer and having a first refractive index; and
a lens part filled in the second opening, disposed between the encapsulation layer and the optical layer, having a curved surface convex toward the optical layer, and having a refractive index equal to or smaller than the first refractive index.

* * * * *